US012610813B2

(12) United States Patent
Liu et al.

(10) Patent No.: US 12,610,813 B2
(45) Date of Patent: Apr. 21, 2026

(54) INTERCONNECT STRUCTURE INCLUDING CHARGED DIELECTRIC LAYERS

(71) Applicant: Taiwan Semiconductor Manufacturing Company, Ltd., Hsinchu (TW)

(72) Inventors: Chien Hung Liu, Hsinchu County (TW); Kuo-Ching Huang, Hsinchu (TW); Harry-Hak-Lay Chuang, Zhubei (TW); Wei-Cheng Wu, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 774 days.

(21) Appl. No.: 17/825,345

(22) Filed: May 26, 2022

(65) Prior Publication Data

US 2023/0387020 A1     Nov. 30, 2023

(51) Int. Cl.
*H01L 23/532* (2006.01)
*H01L 21/768* (2006.01)
(Continued)

(52) U.S. Cl.
CPC .. *H01L 23/53295* (2013.01); *H01L 21/76802* (2013.01); *H01L 21/76832* (2013.01); *H01L 21/76877* (2013.01); *H01L 23/5226* (2013.01); *H01L 24/08* (2013.01); *H01L 24/80* (2013.01); *H01L 2224/08145* (2013.01); *H01L 2224/80895* (2013.01); *H01L 2224/80896* (2013.01)

(58) Field of Classification Search
CPC ......... H01L 23/53295; H01L 21/76802; H01L 21/76832; H01L 23/5226; H01L 2224/08145; H01L 21/76807; H01L 2225/06541; H01L 25/0657
See application file for complete search history.

(56) References Cited

U.S. PATENT DOCUMENTS

2018/0122775 A1* 5/2018 Kao .................... H01L 25/0657
2020/0176380 A1* 6/2020 Chen ................. H01L 21/76898
(Continued)

OTHER PUBLICATIONS

A. Padovani and L. Larcher, "A novel algorithm for the solution of charge transport equations in MANOS devices including charge trapping in alumina and temperature effects," 2010 International Conference on Simulation of Semiconductor Processes and Devices, Bologna, Italy, 2010, pp. 229-232 (Year: 2010).*
(Continued)

*Primary Examiner* — Marlon T Fletcher
*Assistant Examiner* — Da Wei Lee
(74) *Attorney, Agent, or Firm* — Eschweiler & Potashnik, LLC

(57) ABSTRACT

The present disclosure relates to an integrated chip including a first dielectric layer overlying a substrate and a first conductive interconnect within the first dielectric layer. A bonding layer is over the first dielectric layer. The bonding layer includes a bonding dielectric layer and a bonding interconnect in the bonding dielectric layer. A first charged dielectric layer is along a bottom of the first dielectric layer. A second charged dielectric layer is along a top of the first dielectric layer. The first charged dielectric layer and the second charged dielectric layer have a same polarity.

20 Claims, 19 Drawing Sheets

100

(51) Int. Cl.
*H01L 23/00* (2006.01)
*H01L 23/522* (2006.01)

(56) References Cited

U.S. PATENT DOCUMENTS

| | | | | |
|---|---|---|---|---|
| 2022/0084940 | A1* | 3/2022 | Chen .................... | H01L 23/5226 |
| 2022/0293520 | A1* | 9/2022 | Huang .............. | H01L 21/76832 |
| 2024/0387372 | A1* | 11/2024 | Huang .............. | H01L 21/76895 |

OTHER PUBLICATIONS

Ateeq et al. "Capacitance-voltage characteristics of gamma irradiated Al2O3, HfO2, and SiO2 thin films grown by plasma enhanced atomic layer deposition" Proc. SPIE 9491, Sensors for Extreme Harsh Environments II, 949105, published on May 13, 2015.

Sun et al. "A predictivemodelofgrindingforceinsiliconwaferself-rotating grinding" International Journal of Machine Tools & Manufacture 109 (2016) 74-86, published on Jul. 27, 2016.

Black et al. "Investigation of crystalline silicon surface passivation by positively charged POx/Al2O3 stacks" Solar Energy Materials and Solar Cells 185 (2018) 385-391, published on May 4, 2018.

* cited by examiner

300

400

500

600

700

800

900

928
926
924
922
918
920

912
910
908
906
902
904

118
306
124
114
122
304
110
302
106

102

932
930

916
914

120
116

112
108

104

924t
920t 908t
904t 124t
122t

1000

102
104

1100

106
108
102
104

1200

1300

1400

1500

1900

2000

2100

2600

2700

2800

2900

3000

3900 ⬎

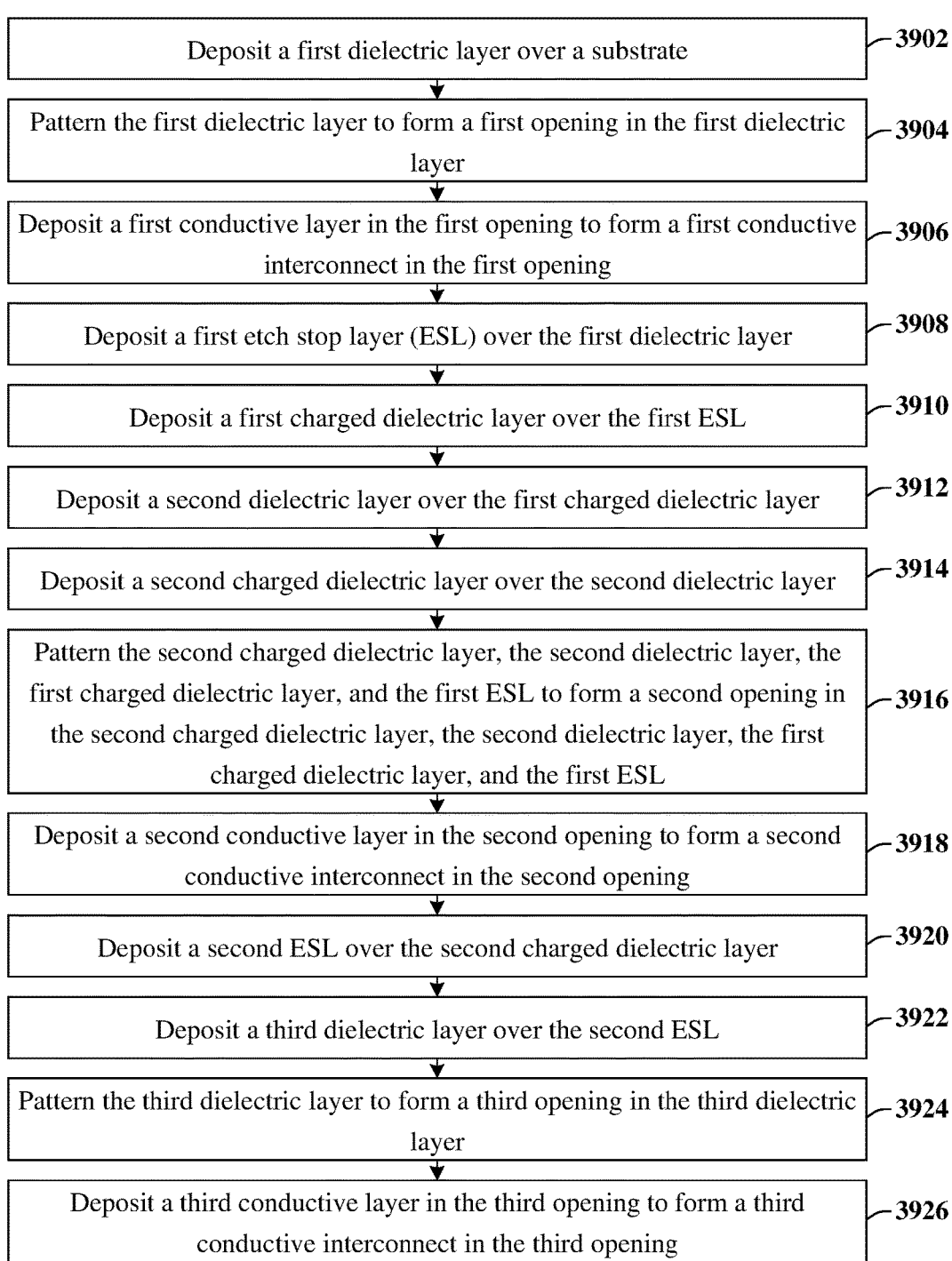

| | |
|---|---|
| Deposit a first dielectric layer over a substrate | 3902 |
| Pattern the first dielectric layer to form a first opening in the first dielectric layer | 3904 |
| Deposit a first conductive layer in the first opening to form a first conductive interconnect in the first opening | 3906 |
| Deposit a first etch stop layer (ESL) over the first dielectric layer | 3908 |
| Deposit a first charged dielectric layer over the first ESL | 3910 |
| Deposit a second dielectric layer over the first charged dielectric layer | 3912 |
| Deposit a second charged dielectric layer over the second dielectric layer | 3914 |
| Pattern the second charged dielectric layer, the second dielectric layer, the first charged dielectric layer, and the first ESL to form a second opening in the second charged dielectric layer, the second dielectric layer, the first charged dielectric layer, and the first ESL | 3916 |
| Deposit a second conductive layer in the second opening to form a second conductive interconnect in the second opening | 3918 |
| Deposit a second ESL over the second charged dielectric layer | 3920 |
| Deposit a third dielectric layer over the second ESL | 3922 |
| Pattern the third dielectric layer to form a third opening in the third dielectric layer | 3924 |
| Deposit a third conductive layer in the third opening to form a third conductive interconnect in the third opening | 3926 |

Fig. 39

INTERCONNECT STRUCTURE INCLUDING CHARGED DIELECTRIC LAYERS

BACKGROUND

Modern day integrated chips contain millions of semiconductor devices. The semiconductor devices are electrically interconnected by way of back-end-of-the-line (BEOL) metal interconnect layers that extend through dielectric layers which are above the devices on an integrated chip. A typical integrated chip comprises a plurality of back-end-of-the-line metal interconnect layers including different sized metal wires vertically coupled together with metal contacts (i.e., vias). Some of the metal interconnect layers are isolated from other metal interconnect layers by the dielectric layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 39 illustrates a flow diagram of some embodiments of a method for forming an integrated chip comprising a first charged dielectric layer and a second charged dielectric layer on opposite sides of a dielectric layer overlying a substrate.

DETAILED DESCRIPTION

Figure 1:
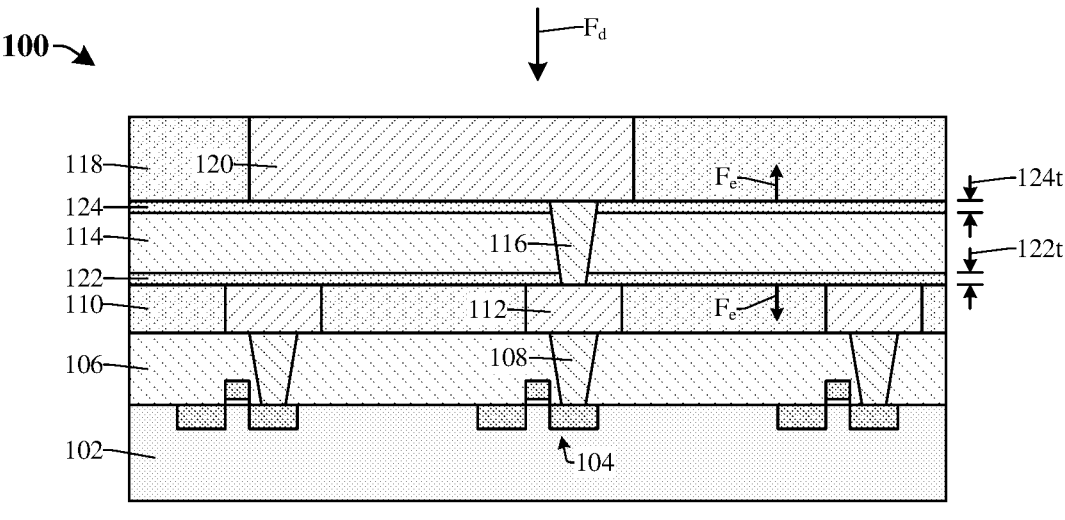
FIG. 1 illustrates a cross-sectional view of some embodiments of an integrated chip comprising a first charged dielectric layer and a second charged dielectric layer on opposite sides of a dielectric layer overlying a substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many semiconductor wafers include a plurality of semiconductor devices arranged along a substrate, a plurality of dielectric layers over the substrate, and a plurality of metal interconnects (e.g., metal lines, metal vias, metal contacts, bond pads, or the like) within the plurality of dielectric layers and coupled to the semiconductor devices. In many chip fabrication processes, a first semiconductor wafer and a second semiconductor wafer are bonded along some of the metal interconnects of the first and second semiconductor wafers. In some methods, after the first semiconductor wafer and the second semiconductor wafer are bonded together, the substrate of the second semiconductor wafer is thinned. For example, a grinding process may be performed on the substrate of the second wafer to reduce the thickness of the substrate.

A challenge with some integrated chips is that in some instances, the downward force applied to the first and second wafers by the grinding process may damage some of the dielectric layers of the first and second wafers. For example, some of the dielectric layers (e.g., low-k dielectric layers, extra low-k dielectric layers, or the like) of the first and second wafers may have an increased susceptibility to cracking when the downward force is applied. Thus, the downward force applied to the first and second wafers during the grinding may cause some such dielectric layers to crack. Dielectric layers having cracks therein may have a reduced reliability. For example, cracked dielectric layers may have a reduced time dependent dielectric breakdown (TDDB). Further, electromigration may be more likely to occur along cracked dielectric layers. Thus, a reliability of the integrated chip as a whole may be reduced.

Various embodiments of the present disclosure are related to an integrated chip including a pair of charged dielectric layers disposed on opposite sides of a dielectric layer for improving a reliability of the dielectric layer. For example, a semiconductor device is arranged along a substrate. A first dielectric layer is over the semiconductor device. A first conductive interconnect is within the first dielectric layer. A second dielectric layer is over the first dielectric layer. A second conductive interconnect is within second dielectric layer. A third dielectric layer is over the second dielectric layer. A third conductive interconnect is within the third dielectric layer. A first charged dielectric layer having a first polarity is disposed along a bottom of the second dielectric layer between the first dielectric layer and the second dielectric layer. A second charged dielectric layer having the first polarity is disposed along a top of the second dielectric layer between the second dielectric layer and the third dielectric layer.

In some instances, the second dielectric layer may have an increased susceptibility to cracking when a downward forced (e.g., from a grinding process being performed on an overlying substrate) is exerted on the second dielectric layer. However, by including the first charged dielectric layer along the bottom of the second dielectric layer and the second charged dielectric layer along the top of the second dielectric layer, a reliability of the second dielectric layer may be improved. For example, because the first charged dielectric layer and the second charged dielectric layer have a same polarity, an electrostatic force exists between the first charged dielectric layer and the second charged dielectric layer that repels the first charged dielectric layer and the second charged dielectric layer from one another. The electrostatic force acting on the second charged dielectric layer may be approximately equal and opposite to the downward force being applied to the second dielectric layer. Thus, the electrostatic force acting on the second charged dielectric layer may counteract the downward force from the grinding. As a result, a likelihood of the second dielectric layer being damaged due to the downward force may be reduced. Accordingly, a reliability of the second dielectric layer may be improved and thus a reliability of the integrated chip as a whole may be improved.

FIG. 1 illustrates a cross-sectional view 100 of some embodiments of an integrated chip comprising a first charged dielectric layer 122 and a second charged dielectric layer 124 on opposite sides of a dielectric layer 114 overlying a substrate 102.

A semiconductor device 104 is disposed along a substrate 102. A contact isolation layer 106 is disposed over the semiconductor device 104. A contact 108 is disposed within the contact isolation layer 106 and is coupled to the semiconductor device 104. A first dielectric layer 110 is disposed over the contact isolation layer 106. A first conductive interconnect 112 (e.g., a first conductive line) is disposed within the first dielectric layer 110. In some embodiments, the contact 108 couples the first conductive interconnect 112 and the semiconductor device 104. A second dielectric layer 114 is disposed over first dielectric layer 110. A second conductive interconnect 116 (e.g., a first conductive via) is disposed within the second dielectric layer 114. In some embodiments, the second conductive interconnect 116 is coupled to the first conductive interconnect 112. A third dielectric layer 118 is over the second dielectric layer 114. A third conductive interconnect 120 (e.g., a second conductive line) is disposed within the third dielectric layer 118. In some embodiments, the third conductive interconnect 120 is coupled to the second conductive interconnect 116.

The first charged dielectric layer 122 is between the first dielectric layer 110 and the second dielectric layer 114. In some embodiments, the first charged dielectric layer 122 is on a bottom surface of the second dielectric layer 114. The second charged dielectric layer 124 is between the second dielectric layer 114 and the third dielectric layer 118. In some embodiments, the second charged dielectric layer 124 is on a top surface of the second dielectric layer 114.

The first charged dielectric layer 122 has a first fixed charge density and the second charged dielectric layer 124 has a second fixed charge density. The first fixed charge density has a first sign (e.g., a positive sign or a negative sign) and the second fixed charge density has the first sign. For example, in some embodiments, both the first fixed charge density and the second fixed charge density are negative. In some other embodiments, both the first fixed charge density and the second fixed charge density are positive. In other words, the first charged dielectric layer 122 and the second charged dielectric layer 124 have a same polarity.

Figure 2:
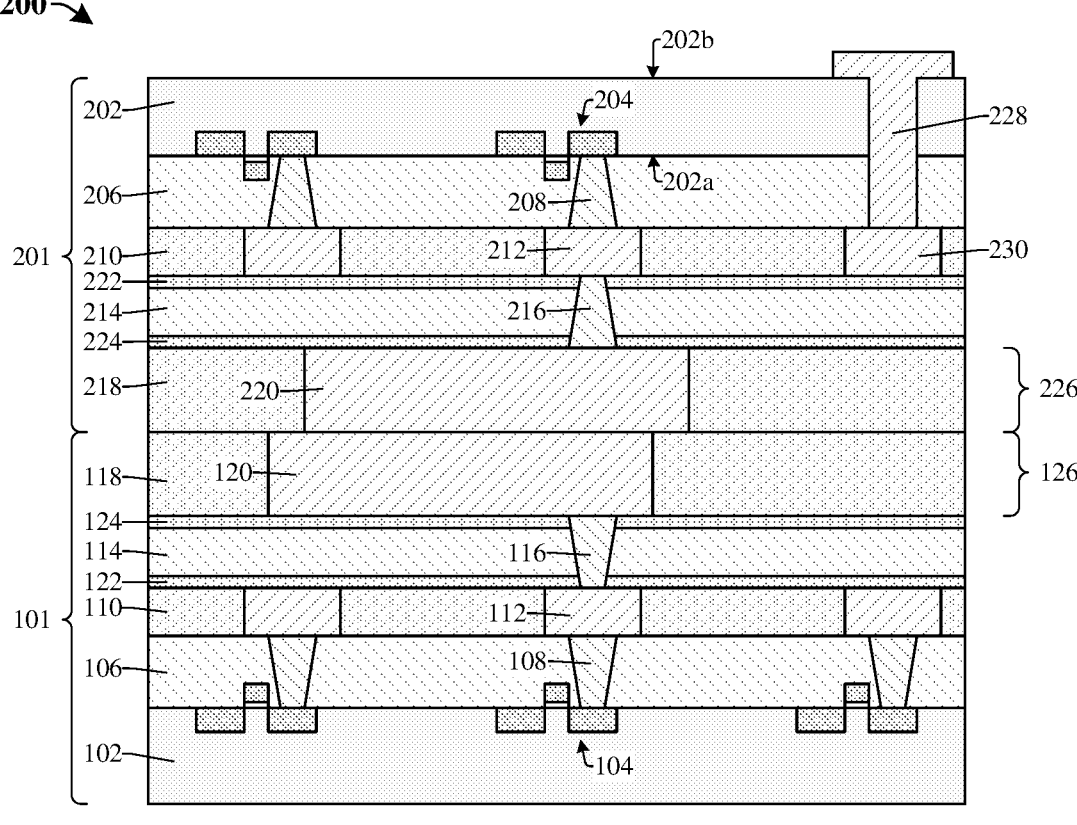
FIG. 2 illustrates a cross-sectional view of some embodiments of the integrated chip of FIG. 1 in which a second wafer portion is disposed over a first wafer portion.

In some embodiments (e.g., as illustrated in FIG. 2), the integrated chip includes a first wafer portion (e.g., 101 of FIG. 2) and a second wafer portion (e.g., 201 of FIG. 2) over the first wafer portion. The second wafer portion includes a substrate (e.g., 202 of FIG. 2). In some embodiments, forming the integrated chip includes bonding the second wafer portion over the first wafer portion and thinning (e.g., performing grinding process or the like) the second wafer portion substrate from a backside (e.g., 202b of FIG. 2) of the second wafer portion substrate. The grinding process exerts a downward force $F_d$ on the layers of the first wafer portion and the second wafer portion.

In some embodiments, the second dielectric layer 114 may have an increased susceptibility to cracking when the downward force $F_d$ is exerted on the second dielectric layer 114 by the grinding process. For example, the second dielectric layer may comprise a structurally fragile dielectric material such as, for example, a low-k dielectric, an extra low-k dielectric, or the like. However, by including the first charged dielectric layer 122 along the bottom of the second dielectric layer 114 and the second charged dielectric layer 124 along the top of the second dielectric layer 114, the susceptibility of the second dielectric layer 114 to cracking may be reduced. For example, because the fixed charge densities of the first charged dielectric layer 122 and the second charged dielectric layer 124 have the same sign (e.g., because the first charged dielectric layer 122 and the second charged dielectric layer 124 have the same polarity), an electrostatic force $F_e$ exists between the first charged dielectric layer 122 and the second charged dielectric layer 124 that repels the first charged dielectric layer 122 and the second charged dielectric layer 124 from one another. In some embodiments, the electrostatic force $F_e$ acting on the second charged dielectric layer 124 may be approximately equal and opposite to the downward force $F_d$ being exerted on the second dielectric layer 114 during the grinding process. Thus, the electrostatic force $F_e$ on the second charged dielectric layer 124 may counteract the downward force $F_d$ exerted on the second dielectric layer 114. As a result, a likelihood of the second dielectric layer 114 being damaged due to the downward force $F_d$ may be reduced. Thus, a reliability of the second dielectric layer 114 may be improved.

The electrostatic force $F_e$ is proportional to the fixed charge densities of the first charged dielectric layer 122 and the second charged dielectric layer 124. The fixed charge densities of the first charged dielectric layer 122 and the second charged dielectric layer 124 depend, in part, on the material(s) of the first charged dielectric layer 122 and the second charged dielectric layer 124. Thus, by controlling the materials of the first charged dielectric layer 122 and the second charged dielectric layer 124, the electrostatic force $F_e$ can be tuned. In some embodiments, the first charged dielectric layer 122 and the second charged dielectric layer 124 both comprise a first dielectric. In some other embodiments, the first charged dielectric layer 122 comprises a first dielectric and the second charged dielectric layer 124 comprises a second dielectric, different from the first dielectric. In some embodiments, the first charged dielectric layer 122 and/or the second charged dielectric layer may, for example, comprise hafnium oxide, aluminum oxide, tantalum oxide, gallium oxide, titanium oxide, niobium oxide, or some other suitable material. In some embodiments, the absolute values of the first fixed charge density and the second fixed charge density are in a range from about $10^{10}$ cm$^{-2}$ to about $10^{14}$ cm$^{-2}$, about $10^{11}$ cm$^{-2}$ to about $10^{13}$ cm$^{-2}$, or some other suitable range.

Further, the thicknesses 122t, 124t of the first charged dielectric layer 122 and the second charged dielectric layer 124 can affect the fixed charge densities of the first charged dielectric layer 122 and the second charged dielectric layer 124. Thus, by controlling the thicknesses 122t, 124t of the first charged dielectric layer 122 and the second charged dielectric layer 124, the electrostatic force $F_e$ can be further tuned. In some embodiments, the thickness 122t of the first charged dielectric layer 122 and the thickness 124t of the second charged dielectric layer 124 may be in a range from about 40 angstroms to about 400 angstroms or some other suitable range.

Although FIG. 1 illustrates the charged dielectric layers 122, 124 disposed on opposite sides of the second dielectric layer 114, it will be appreciated that in some embodiments, the charged dielectric layers 122, 124 can alternatively be included on opposite sides of some other dielectric layer to reduce the likelihood of that dielectric layer cracking due to the downward force $F_d$ of the grinding.

In some embodiments, the substrate 102 may, for example, comprise silicon, germanium, gallium arsenide, or some other suitable material. In some embodiments, the semiconductor device 104 may, for example, be or comprise a metal-oxide-semiconductor field-effect transistor (MOS-FET), a bipolar junction transistor (BJT), a junction field-effect transistor (JFET), a fin field-effect transistor (Fin FET), a gate all-around field effect transistor (GAA FET) or some other suitable device. In some embodiments, the contact isolation layer 106 may, for example, comprise silicon dioxide, silicon glass, or some other suitable material. In some embodiments, any of the contact 108, the first conductive interconnect 112, the second conductive interconnect 116, and the third conductive interconnect 120 may, for example, comprise any of copper, tungsten, aluminum, ruthenium, molybdenum, or some other suitable material. In some embodiments, the second conductive interconnect 116 and the third conductive interconnect 120 may comprise the same or different conductive material(s). In some embodiments, any of the first dielectric layer 110, the second dielectric layer 114, and the third dielectric layer 118 may, for example, comprise any of silicon dioxide, silicon oxy-carbide (e.g., SiOC), SiOCH, or some other suitable material.

FIG. 2 illustrates a cross-sectional view 200 of some embodiments of the integrated chip of FIG. 1 in which a second wafer portion 201 is disposed over a first wafer portion 101.

The second wafer portion includes a substrate 202 and a semiconductor device 204 disposed along a frontside 202a of substrate 202. A contact 208 is disposed within a contact isolation layer 206 on the frontside 202a of substrate 202. Conductive interconnects 212, 216, 220 are disposed within dielectric layers 210, 214, 218 on the frontside 202a of substrate 202. In some embodiments, the second wafer portion 201 is inverted relative to the first wafer portion 101 such that a backside 202b of substrate 202 is over the frontside 202a of substrate 202.

In some embodiments, the first wafer portion 101 includes a first bonding layer 126 (e.g., a first hybrid bonding layer) and the second wafer portion 201 includes a second bonding layer 226. In some embodiments, the first bonding layer 126 includes a first bonding dielectric layer (e.g., third dielectric layer 118) and one or more first bonding interconnects (e.g., third conductive interconnect 120). Similarly, the second bonding layer 226 includes a second bonding dielectric layer (e.g., dielectric layer 218) and one or more second bonding interconnects (e.g., conductive interconnect 220). The first wafer portion 101 and the second wafer portion 201 are bonded along the first and second bonding layers 126, 226 (e.g., by a fusion bonding process, a plasma bonding process, a hybrid bonding process, or the like). In some embodiments, the second wafer portion 201 includes a through-substrate via (TSV) 228 over substrate 202 and extending through substrate 202 to a conductive interconnect 230 of the second wafer portion 201.

In some embodiments, the second wafer portion 201 includes charged dielectric layers 222, 224 on opposite sides of dielectric layer 214. In some embodiments, dielectric layer 214 may have an increased susceptibility to cracking when a grinding process is performed on substrate 202, and by including the charged dielectric layers 222, 224 on opposite sides of dielectric layer 214, the likelihood of dielectric layer 214 cracking due to the grinding may be reduced.

Although the charged dielectric layers 222, 224 of the second wafer portion 201 are illustrated as being on a same interconnect level as the charged dielectric layers 122, 124 of the first wafer portion 101, it will be appreciated that in some embodiments, the charged dielectric layers 222, 224 of the second wafer portion 201 and the charged dielectric layers 122, 124 of the first wafer portion 101 can alternatively be on different interconnect levels.

Figure 3:
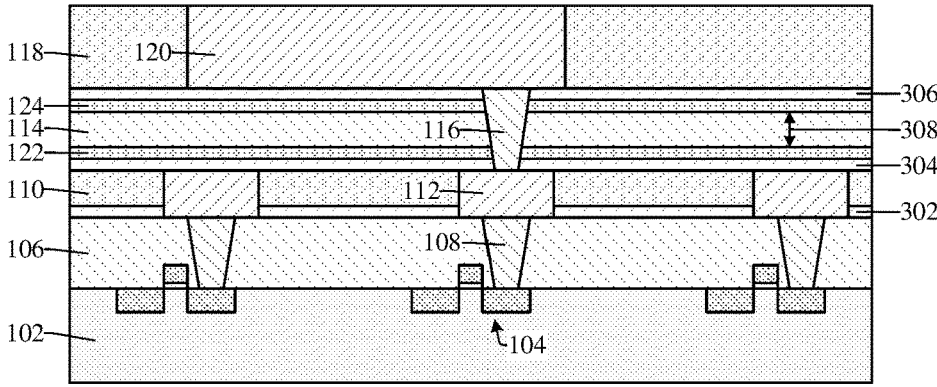
FIG. 3 illustrates a cross-sectional view of some embodiments of the integrated chip of FIG. 1 in which a first etch stop layer (ESL), a second ESL, and a third ESL are disposed over the substrate.

FIG. 3 illustrates a cross-sectional view 300 of some embodiments of the integrated chip of FIG. 1 in which a first etch stop layer (ESL) 302, a second ESL 304, and a third ESL 306 are disposed over the substrate 102.

The first ESL 302 is between the contact isolation layer 106 and the first dielectric layer 110. The first ESL 302 is on opposite sidewalls of the first conductive interconnect 112 along a bottom surface of the first conductive interconnect 112. The second ESL 304 is between the first dielectric layer 110 and the second dielectric layer 114. In some embodiments, the second ESL 304 is on a top surface of the first dielectric layer 110, the first charged dielectric layer 122 is on a top surface of the second ESL 304, and the second dielectric layer 114 is on a top surface of the first charged dielectric layer 122. The third ESL 306 is between the second dielectric layer 114 and the third dielectric layer 118. In some embodiments, the second charged dielectric layer 124 is on a top surface of the second dielectric layer 114, the third ESL 306 is on a top surface of the second charged dielectric layer 124, and the third dielectric layer 118 is on a top surface of the third ESL 306.

In some embodiments, the third conductive interconnect 120 is on an top surface of the third ESL 306. The second conductive interconnect 116 extends vertically through the third ESL 306, through the second charged dielectric layer 124, through the second dielectric layer 114, through the first charged dielectric layer 122, and through the second ESL 304 from the third conductive interconnect 120 to the first conductive interconnect 112.

The electrostatic force (e.g., $F_e$ of FIGS. 1 and 2) between the first charged dielectric layer 122 and the second charged dielectric layer 124 is inversely proportional to a distance 308 between the first charged dielectric layer 122 and the second charged dielectric layer 124. Thus, by including the first charged dielectric layer 122 and the second charged dielectric layer 124 on the bottom surface and the top surface of second dielectric layer 114, respectively, the distance 308 between the first charged dielectric layer 122 and the second charged dielectric layer 124 can be decreased and hence the electrostatic force can be increased. In some embodiments, the distance 308 between the first charged dielectric layer 122 and the second charged dielectric layer 124 is in a range from about 2000 angstroms to 4000 angstroms, about 2500 angstroms to 3500 angstroms, or some other suitable range.

In some embodiments, the second ESL 304 comprises a first dielectric and the first charged dielectric layer 122 comprises a second dielectric, different from the first dielectric. In some embodiments, the second charged dielectric layer 124 comprises a third dielectric and the third ESL 306 comprises a fourth dielectric, different from the third dielectric. In some embodiments, any of the first ESL 302, the second ESL 304, and the third ESL 306 may, for example, comprise silicon nitride, silicon carbide, silicon carbonitride, or some other suitable material.

Figure 4:
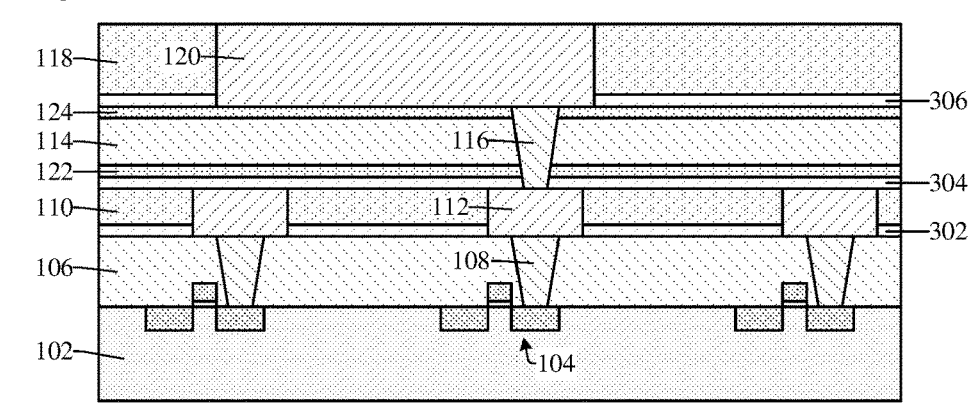
FIG. 4 illustrates a cross-sectional view of some other embodiments of the integrated chip of FIG. 3.

FIG. 4 illustrates a cross-sectional view 400 of some embodiments of the integrated chip of FIG. 3 in which a bottom surface of the third conductive interconnect 120 is on a top surface of the second charged dielectric layer 124.

The third ESL 306 is on opposite sidewalls of the third conductive interconnect 120 along a bottom surface of the third conductive interconnect 120. The second conductive interconnect 116 extends vertically through the second charged dielectric layer 124, through the second dielectric layer 114, through the first charged dielectric layer 122, and through the second ESL 304 from the third conductive interconnect 120 to the first conductive interconnect 112.

Figure 5:
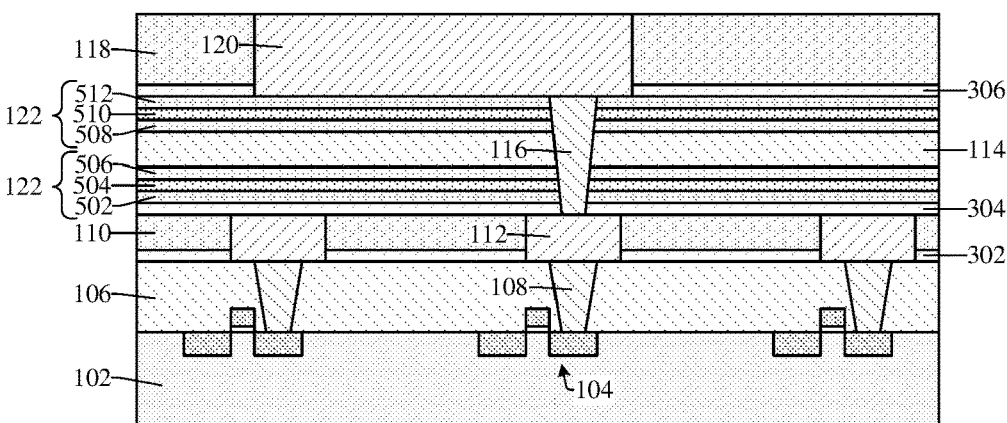
FIG. 5 illustrates a cross-sectional view of some embodiments of the integrated chip of FIG. 4 in which the first charged dielectric layer comprises a first plurality of charged dielectric films and the second charged dielectric layer comprises a second plurality of charged dielectric films.

FIG. 5 illustrates a cross-sectional view 500 of some embodiments of the integrated chip of FIG. 4 in which the first charged dielectric layer 122 comprises a first plurality of charged dielectric films and the second charged dielectric layer 124 comprises a second plurality of charged dielectric films.

For example, in some embodiments, the first charged dielectric layer 122 includes a first charged dielectric film 502, a second charged dielectric film 504 over the first charged dielectric film 502, and a third charged dielectric film 506 over the second charged dielectric film 504. Further, the second charged dielectric layer 124 includes a fourth charged dielectric film 508, a fifth charged dielectric film 510 over the fourth charged dielectric film 508, and a sixth charged dielectric film 512 over the fifth charged dielectric film 510. Each of the charged dielectric films have a same polarity.

In some embodiments, the first charged dielectric film 502 and the sixth charged dielectric film 512 comprise a first charged dielectric material having a first fixed charge density, the second charged dielectric film 504 and the fifth charged dielectric film 510 comprise a second charged dielectric material having a second fixed charge density, and the third charged dielectric film 506 and the fourth charged dielectric film 508 comprise a third charged dielectric material having a third fixed charge density. In some other embodiments, the first charged dielectric film 502 and the fourth charged dielectric film 508 comprise a first charged dielectric material having a first fixed charge density, the second charged dielectric film 504 and the fifth charged dielectric film 510 comprise a second charged dielectric material having a second fixed charge density, and the third charged dielectric film 506 and the sixth charged dielectric film 512 comprise a third charged dielectric material having a third fixed charge density. In some embodiments, any of the charged dielectric films may, for example, comprise any of hafnium oxide, aluminum oxide, tantalum oxide, gallium oxide, titanium oxide, niobium oxide, or some other suitable material.

In some embodiments, by having multiple charged dielectric films comprising different dielectric materials, a net fixed charged density of the first charged dielectric layer 122 and a net fixed charged density of the second charged dielectric layer 124 can be further tuned. Thus, the electrostatic force between the first charged dielectric layer 122 and the second charged dielectric layer 124 can be further tuned.

In some embodiments, the thicknesses of the charged dielectric films 502, 504, 506, 508, 510, 512 can be controlled to further tune the net fixed charge densities of the charged dielectric layers 122, 124. For example, in some embodiments, the first charged dielectric film 502 and the sixth charged dielectric film 512 have a first thickness, the second charged dielectric film 504 and the fifth charged dielectric film 510 have a second thickness, different from the first thickness, and the third charged dielectric film 506 and the fourth charged dielectric film 508 have a third thickness, different from the first thickness and the second thickness. In some other embodiments, the first charged dielectric film 502 and the fourth charged dielectric film 508 have a first thickness, the second charged dielectric film 504 and the fifth charged dielectric film 510 have a second thickness, different from the first thickness, and the third charged dielectric film 506 and the sixth charged dielectric film 512 have a third thickness, different from the first thickness and the second thickness.

Figure 6:
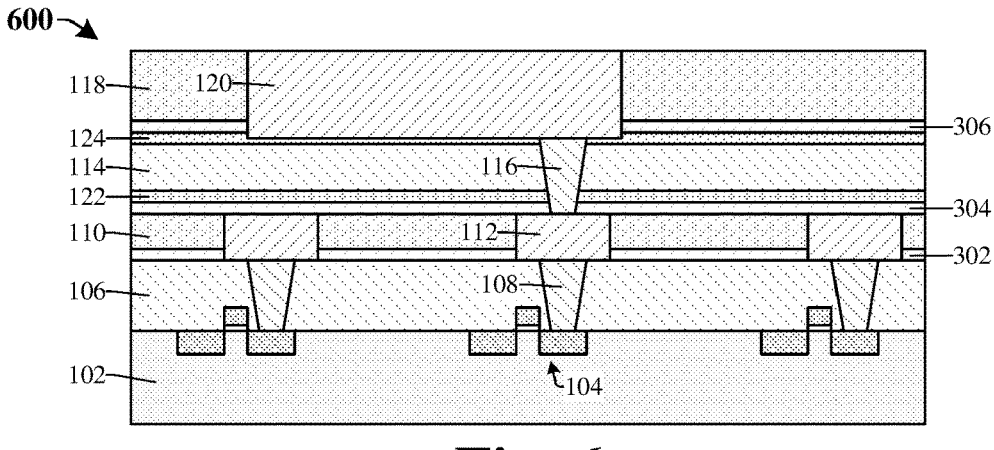
FIG. 6-8 illustrate cross-sectional views of some other embodiments of the integrated chip of FIG. 3.

FIG. 6 illustrates a cross-sectional view 600 of some embodiments of the integrated chip of FIG. 3 in which the bottom surface of the third conductive interconnect 120 is below the top surface of the second charged dielectric layer 124 and above a bottom surface of the second charged dielectric layer 124.

The third ESL 306 and the second charged dielectric layer 124 are on opposite sidewalls of the third conductive interconnect 120. The third conductive interconnect 120 is on an upper surface of the second charged dielectric layer 124. The second conductive interconnect 116 extends vertically through the second charged dielectric layer 124, through the second dielectric layer 114, through the first charged dielectric layer 122, and through the second ESL 304 from the third conductive interconnect 120 to the first conductive interconnect 112.

Figure 7:
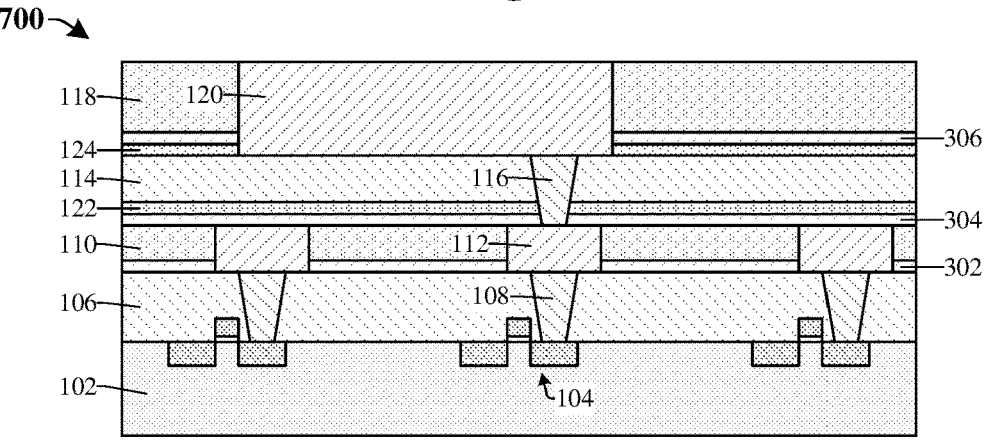

FIG. 7 illustrates a cross-sectional view 700 of some embodiments of the integrated chip of FIG. 3 in which the bottom surface of the third conductive interconnect 120 is on a top surface of the second dielectric layer 114.

The third ESL 306 and the second charged dielectric layer 124 are on opposite sidewalls of the third conductive interconnect 120. The second conductive interconnect 116 extends vertically through the second dielectric layer 114, through the first charged dielectric layer 122, and through the second ESL 304 from the third conductive interconnect 120 to the first conductive interconnect 112.

Figure 8:
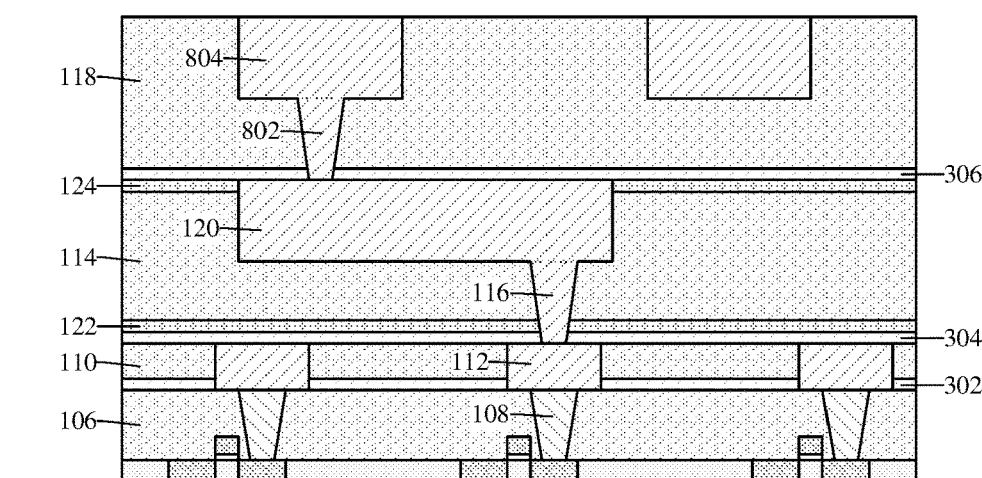

FIG. 8 illustrates a cross-sectional view 800 of some embodiments of the integrated chip of FIG. 3 in which both the second conductive interconnect 116 and the third conductive interconnect 120 are disposed within the second dielectric layer 114.

The second charged dielectric layer 124 is disposed on opposite sidewalls of the third conductive interconnect 120 along a top surface of the third conductive interconnect 120. The third ESL 306 is on the top surface of the third conductive interconnect 120. In some embodiments, the second conductive interconnect 116 and the third conductive interconnect 120 comprise a same continuous conductive layer.

In some embodiments, a fourth conductive interconnect 802 is disposed within the third dielectric layer 118 and over the third conductive interconnect 120. Further, a fifth conductive interconnect 804 is disposed within the third dielectric layer 118 and over the fourth conductive interconnect 802. The fourth conductive interconnect 802 extends vertically through the third dielectric layer 118 and the third ESL 306 from the fifth conductive interconnect 804 to the third conductive interconnect 120. In some embodiments, the fourth conductive interconnect 802 and the fifth conductive interconnect 804 comprise a same continuous conductive layer.

Figure 9:
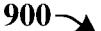
FIG. 9 illustrates a cross-sectional view of some embodiments of the integrated chip of FIG. 4 in which additional charged dielectric layers are disposed over the substrate.
Figure 9:
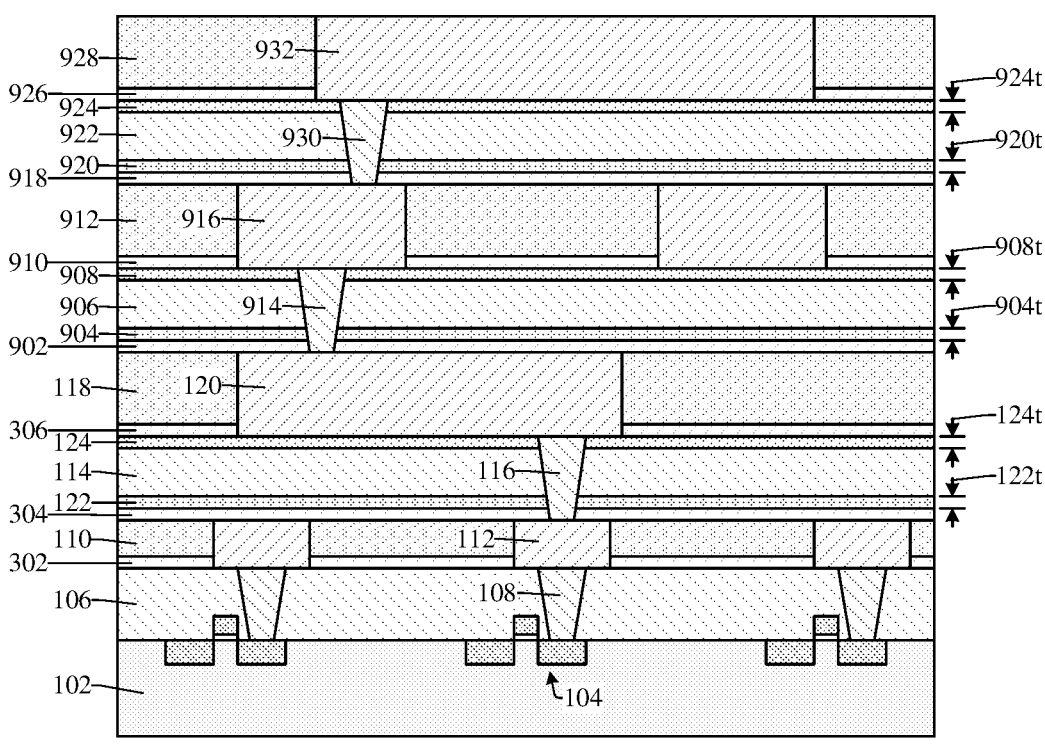

FIG. 9 illustrates a cross-sectional view 900 of some embodiments of the integrated chip of FIG. 4 in which additional charged dielectric layers are disposed over the substrate 102.

For example, in some embodiments, a fourth ESL 902 is over the third dielectric layer 118, a third charged dielectric layer 904 is over the fourth ESL 902, and a fourth dielectric layer 906 is over the third charged dielectric layer 904. A fourth charged dielectric layer 908 is over the fourth dielectric layer 906, a fifth ESL 910 is over the fourth charged dielectric layer 908, and a fifth dielectric layer 912 is over the fifth ESL 910. A fourth conductive interconnect 914 is over the third conductive interconnect 120 and within the fourth dielectric layer 906. A fifth conductive interconnect 916 is over the fourth conductive interconnect 914 and within the fifth dielectric layer 912. In some embodiments, the fourth conductive interconnect 914 extends through the fourth charged dielectric layer 908, the fourth dielectric layer 906, the third charged dielectric layer 904, and the fourth ESL 902. Further in some embodiments, the fourth conductive interconnect 914 couples the fifth conductive interconnect 916 and the third conductive interconnect 120.

Further, in some embodiments, a sixth ESL 918 is over the fifth dielectric layer 912, a fifth charged dielectric layer 920 is over the sixth ESL 918, and a sixth dielectric layer 922 is over the fifth charged dielectric layer 920. A sixth charged dielectric layer 924 is over the sixth dielectric layer 922, a seventh ESL 926 is over the sixth charged dielectric layer 924, and a seventh dielectric layer 928 is over the seventh ESL 926. A sixth conductive interconnect 930 is over the fifth conductive interconnect 916 and within the sixth dielectric layer 922. A seventh conductive interconnect 932 is over the sixth conductive interconnect 930 and within the seventh dielectric layer 928. In some embodiments, the sixth conductive interconnect 930 extends through the sixth charged dielectric layer 924, the sixth dielectric layer 922, the fifth charged dielectric layer 920, and the sixth ESL 918. Further in some embodiments, the sixth conductive interconnect 930 couples the seventh conductive interconnect 932 and the fifth conductive interconnect 916.

In some embodiments, the first charged dielectric layer 122 has a first thickness 122t and the second charged dielectric layer 124 has a second thickness 124t, approximately equal (e.g., within 5%, within 10%, or within some other suitable threshold) to the first thickness 122t. Further, the third charged dielectric layer 904 has a third thickness 904t and the fourth charged dielectric layer 908 has a fourth thickness 908t, approximately equal to the third thickness 904t. Furthermore, the fifth charged dielectric layer 920 has a fifth thickness 920t and the sixth charged dielectric layer 924 has a sixth thickness 924t, approximately equal to the fifth thickness 920t.

In some embodiments, by having the thicknesses of the pairs of charged dielectric layers be approximately equal, the fixed charge densities of each of the pairs of charged dielectric layers can be balanced. For example, by having the thicknesses of the first charged dielectric layer 122 and the second charged dielectric layer 124 be approximately equal, the fixed charge densities of the first charged dielectric layer 122 and the second charged dielectric layer 124 can be balanced. Further, by having the thicknesses of the third charged dielectric layer 904 and the fourth charged dielectric layer 908 be approximately equal, the fixed charged densities of the third charged dielectric layer 904 and the fourth charged dielectric layer 908 can be balanced.

In some embodiments, each of the first thickness 122t, the second thickness 124t, the third thickness 904t, the fourth thickness 908t, the fifth thickness 920t, and the sixth thickness 924t are approximately equal. In some other embodiments, the fifth thickness 920t and the sixth thickness 924t are greater than the third thickness 904t and the fourth thickness 908t, and the third thickness 904t and the fourth thickness 908t are greater than the first thickness 122t and the second thickness 124t. In other words, in some embodiments, the thicknesses of the pairs of charged dielectric layers increase as the height at which the pairs of charged dielectric layers are disposed above the substrate 102 increases.

In some embodiments, first charged dielectric layer 122 and the second charged dielectric layer comprise a first dielectric, the third charged dielectric layer 904 and the fourth charged dielectric layer 908 comprise a second dielectric, and the fifth charged dielectric layer 920 and the sixth charged dielectric layer 924 comprise a third dielectric. In some embodiment's, each of the first dielectric, the second dielectric, and the third dielectric are the same. In some other embodiments, each of the first dielectric, the second dielectric, and the third dielectric are different.

Figure 29:
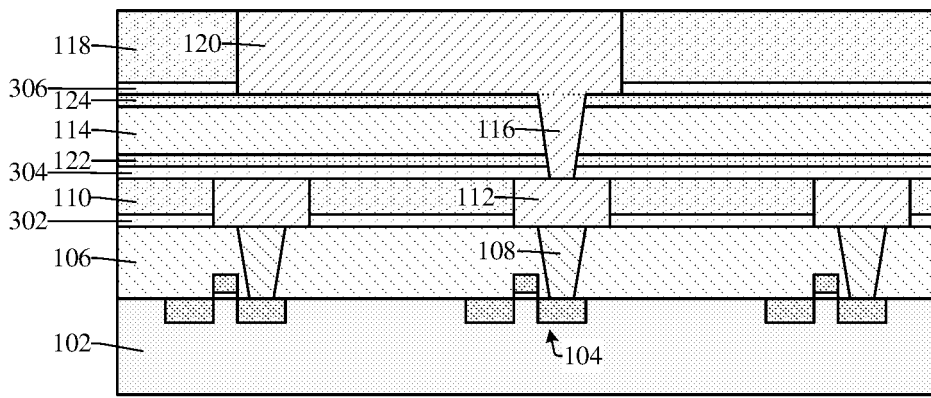
Figure 30:
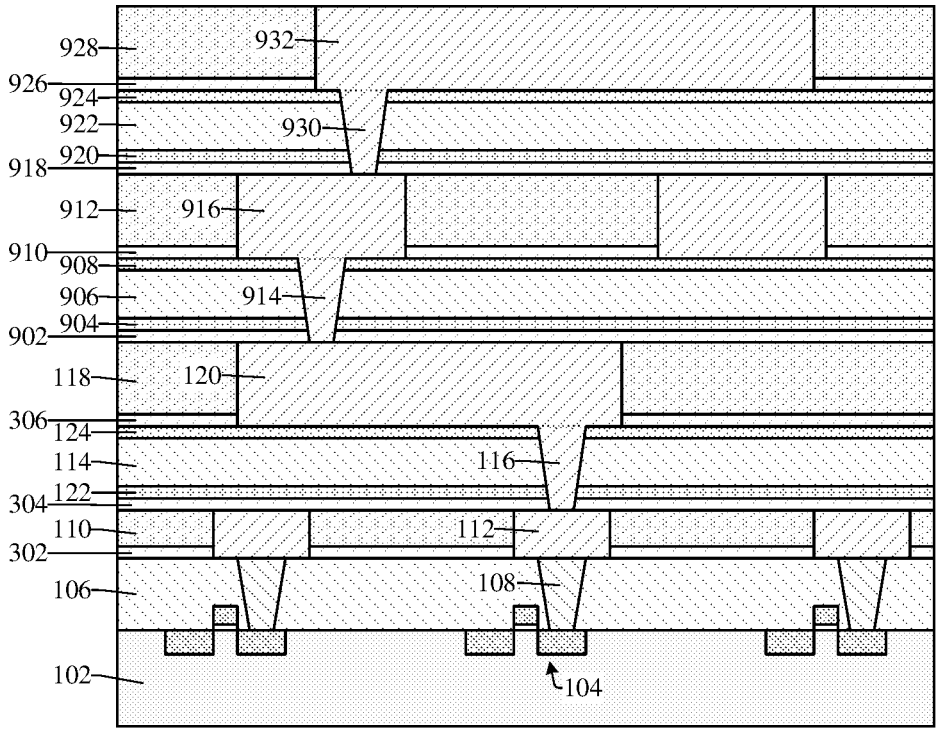

Although FIGS. 1-7 and FIG. 9 illustrate single damascene interconnect schemes where a conductive line (e.g., 120) and an underlying the conductive via (e.g., 116) comprise separate conductive layers (e.g., conductive layers that are separated by a grain boundary and/or that comprise different conductive materials), it will be appreciated that in some embodiments, dual damascene interconnect schemes can alternatively be implemented. For example, a conductive line (e.g., 120) and an underlying conductive via (e.g., 116) can alternatively be comprise a same continuous conductive layer (as shown in FIGS. 29 and 30).

FIGS. 10-25 illustrate cross-sectional views 1000-2500 of some embodiments of a method for forming an integrated chip comprising a first charged dielectric layer 122 and a second charged dielectric layer 124 on opposite sides of a dielectric layer 114 overlying a substrate 102. Although FIGS. 10-25 are described in relation to a method, it will be appreciated that the structures disclosed in FIGS. 10-25 are not limited to such a method, but instead may stand alone as structures independent of the method.

Figure 10:
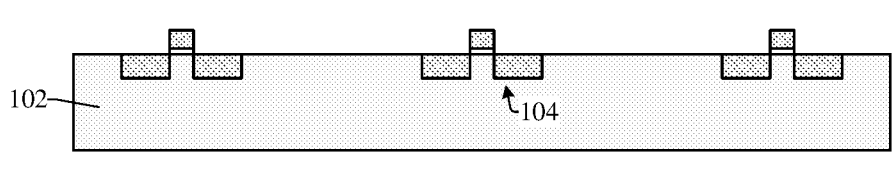
FIGS. 10-25 illustrate cross-sectional views of some embodiments of a method for forming an integrated chip comprising a first charged dielectric layer and a second charged dielectric layer on opposite sides of a dielectric layer overlying a substrate.

As shown in cross-sectional view 1000 of FIG. 10, a semiconductor device 104 is formed along a substrate 102. For example, in some embodiments, the semiconductor device 104 is formed along the substrate 102 by performing depositing a gate dielectric layer (not labeled) and a gate layer (not labeled) over the substrate 102, patterning the gate layer and the gate dielectric layer to delimit a gate (not labeled), an performing an implantation process to form a pair of source/drains (not labeled) in the substrate 102 on opposite sides of the gate.

Figure 11:
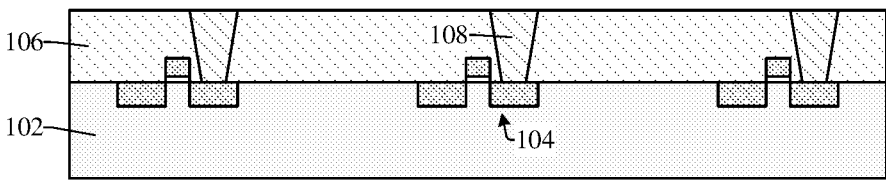

As shown in cross-sectional view 1100 of FIG. 11, a contact isolation layer 106 is deposited over the substrate 102 and a contact 108 is formed in the contact isolation layer 106. For example, in some embodiments, the contact isolation layer 106 is deposited over the substrate 102, the contact isolation layer 106 is patterned to form a contact opening (not shown) in the contact isolation layer 106, and a contact metal layer (not labeled) is deposited over the contact isolation layer 106 and in the contact opening to form the contact 108 in the contact opening. In some embodiments, a planarization process is performed on the contact metal layer and the contact isolation layer 106 after the contact metal layer is deposited over the contact isolation layer 106. In some embodiments, the planarization process comprises a chemical mechanical planarization (CMP) process or some other suitable planarization process.

Figure 12:
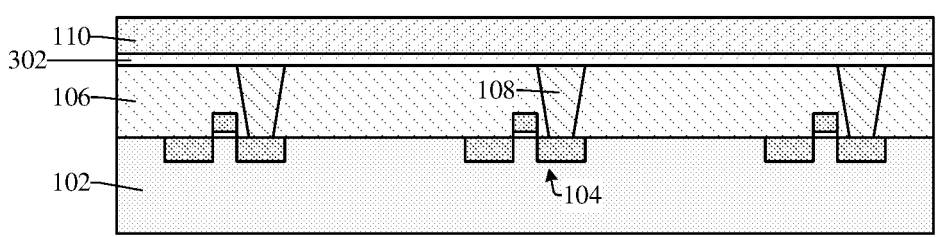

As shown in cross-sectional view 1200 of FIG. 12, a first etch stop layer (ESL) 302 is deposited over the contact isolation layer 106 and over the contact 108. Further, a first dielectric layer 110 is deposited over the first ESL 302. In some embodiments, the first ESL 302 comprises silicon nitride, silicon carbide, silicon carbonitride, or some other suitable material and is deposited by a chemical vapor deposition (CVD) process, a physical vapor deposition (PVD) process, an atomic layer deposition (ALD) process, or some other suitable process. In some embodiments, the first dielectric layer 110 comprises silicon dioxide or some other suitable material and is deposited by a CVD process, a PVD process, an ALD process, or some other suitable process.

Figure 13:
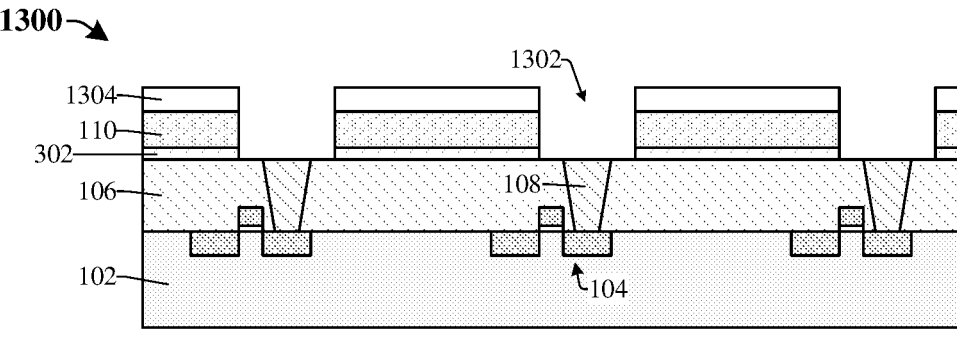

As shown in cross-sectional view 1300 of FIG. 13, the first dielectric layer 110 and the first ESL 302 are patterned to form a first interconnect opening 1302 in the first dielectric layer 110 and the first ESL 302. The first interconnect opening 1302 is delimited by sidewalls of the first dielectric layer 110 and sidewalls of the first ESL 302. In some embodiments, the patterning comprises forming a masking layer 1304 over the first dielectric layer 110 and etching the first dielectric layer 110 and the first ESL 302 according to the masking layer 1304. In some embodiments, the etching comprises a dry etching process (e.g., a plasma etching process, a reactive ion etching process, an ion beam etching process, or the like) or some other suitable process. In some embodiments, the masking layer 1304 is removed during and/or after the etching. In some embodiments, the etching comprises a first etch that extends through the first dielectric layer 110 and a second etch that extends through the first ESL 302.

Figure 14:
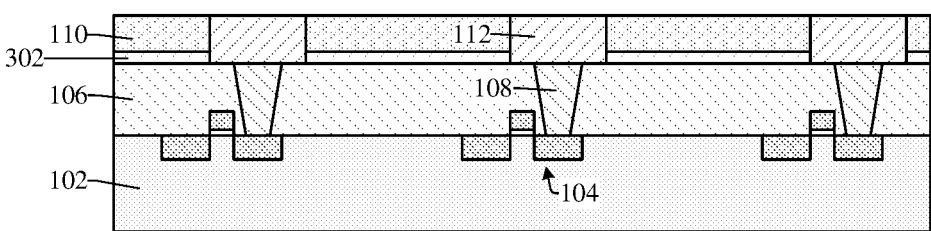

As shown in cross-sectional view 1400 of FIG. 14, a first conductive layer (not labeled) is deposited over the first dielectric layer 110 and in the first interconnect opening 1302 to form a first conductive interconnect 112 (e.g., a conductive line) in the first interconnect opening 1302. In some embodiments, a planarization process is performed on the first conductive layer and first dielectric layer 110 after the first conductive layer is deposited over the first dielectric layer 110. In some embodiments, the planarization process comprises a CMP process or some other suitable planarization process. In some embodiments, the first conductive layer comprises copper, tungsten, aluminum, ruthenium, molybdenum, or some other suitable material and is deposited by a sputtering process, an electrochemical deposition (ECD) process, an electroless deposition (ELD) process, a CVD process, a PVD process, an ALD process, or some other suitable process.

Figure 15:
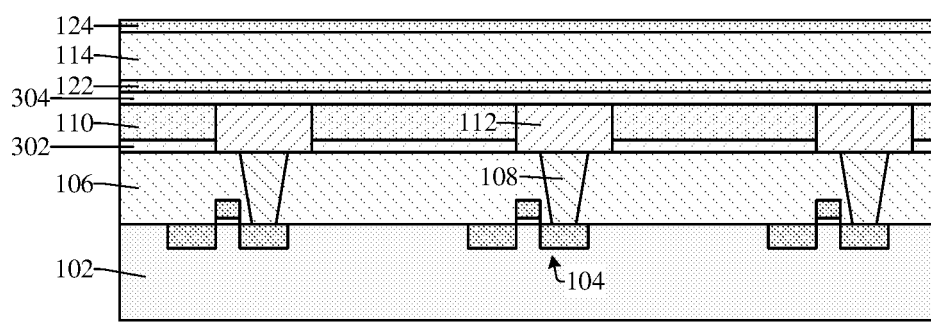

As shown in cross-sectional view 1500 of FIG. 15, a second ESL 304 is deposited over the first dielectric layer 110 and over the first conductive interconnect 112. A first charged dielectric layer 122 is deposited over the second ESL 304. A second dielectric layer 114 is deposited over the first charged dielectric layer 122. A second charged dielectric layer 124 is deposited over the second dielectric layer 114.

In some embodiments, the first charged dielectric layer 122 comprises a first charged dielectric material (e.g., hafnium oxide, aluminum oxide, tantalum oxide, gallium oxide, titanium oxide, niobium oxide, or some other suitable material) having a first fixed charge density, and is deposited by a CVD process, a PVD process, an ALD process, or some other suitable process. In some embodiments, the second charged dielectric layer 124 comprises a second charged dielectric material (e.g., hafnium oxide, aluminum oxide, tantalum oxide, gallium oxide, titanium oxide, niobium oxide, or some other suitable material) having a second fixed charge density, and is deposited by a CVD process, a PVD process, an ALD process, or some other suitable process. The first fixed charge density and the second fixed charge density have a same sign. In other words, the first charged dielectric layer 122 and the second charged dielectric layer 124 have a same polarity.

In some embodiments, the thickness of the deposited charged dielectric layers 122, 124 is controlled to tune the fixed charged densities of the charged dielectric layers 122, 124. Further, a temperature at which the charged dielectric layers 122, 124 are deposited can affect the fixed charge densities of the charged dielectric layers 122, 124. Thus, in some embodiments, the temperature at which the charged dielectric layers 122, 124 are deposited is controlled to tune the fixed charged densities of the charged dielectric layers 122, 124. In some embodiments, the temperature at which the charged dielectric layers 122, 124 are deposited is in a range from about 100 degrees Celsius to about 350 degrees Celsius, about 150 degrees Celsius to about 300 degrees Celsius, or some other suitable range. In some embodiments, depositing the charged dielectric layers 122, 124 includes depositing a plurality of charged dielectric films.

In some embodiments, the second ESL 304 comprises silicon nitride, silicon carbide, silicon carbonitride, or some other suitable material and is deposited by a CVD process, a PVD process, an ALD process, or some other suitable process. In some embodiments, the second dielectric layer 114 comprises a low-k dielectric, an extra low-k dielectric, or the like. For example, the second dielectric layer 114 may comprise silicon dioxide, silicon oxycarbide, SiOCH, or some other suitable material and may be deposited by a CVD process, a PVD process, an ALD process, or some other suitable process.

Figure 16:
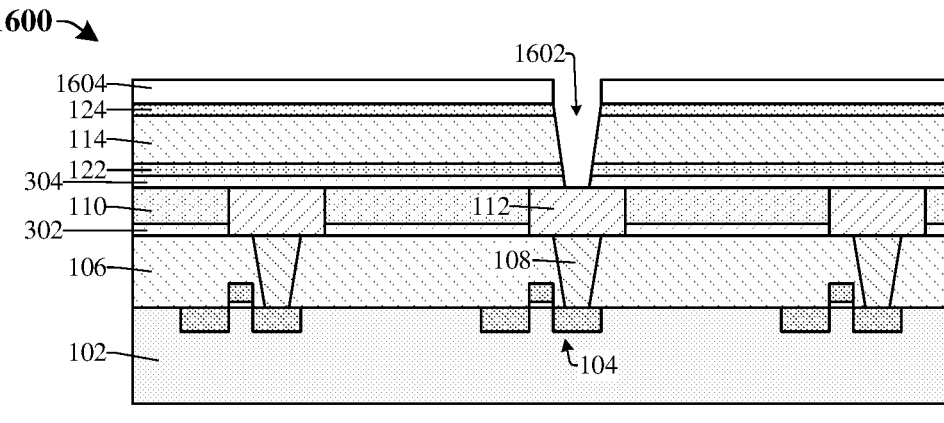

As shown in cross-sectional view 1600 of FIG. 16, the second charged dielectric layer 124, the second dielectric layer 114, the first charged dielectric layer 122, and the second ESL 304 are patterned to form a second interconnect opening 1602 in the second charged dielectric layer 124, the second dielectric layer 114, the first charged dielectric layer 122, and the second ESL 304. The second interconnect opening 1602 is delimited by sidewalls of the second charged dielectric layer 124, sidewalls of the second dielectric layer 114, sidewalls of the first charged dielectric layer 122, and sidewalls of the second ESL 304. In some embodiments, the patterning comprises forming a masking layer 1604 over the second charged dielectric layer 124 and etching the second charged dielectric layer 124, the second dielectric layer 114, the first charged dielectric layer 122, and the second ESL 304 according to the masking layer 1604. In some embodiments, the etching comprises a dry etching process or some other suitable process. In some embodiments, the masking layer 1604 is removed during and/or after the etching. In some embodiments, the etching comprises a first etch that extends through the second charged dielectric layer 124, the second dielectric layer 114, and the first charged dielectric layer 122, and a second etch that extends through the second ESL 304.

Figure 17:
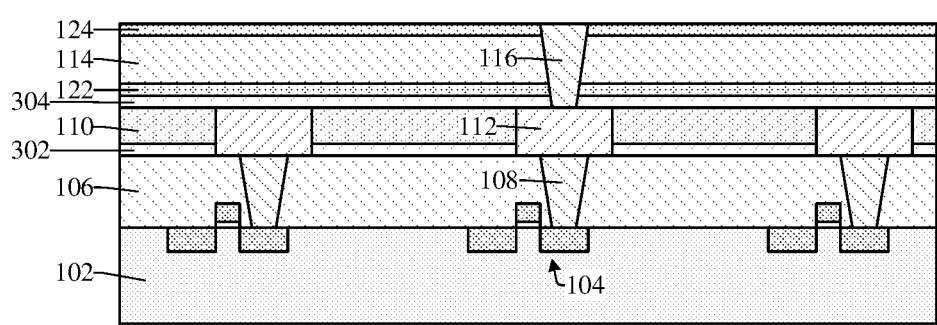

As shown in cross-sectional view 1700 of FIG. 17, a second conductive layer (not labeled) is deposited over the second charged dielectric layer 124 and in the second interconnect opening 1602 to form a second conductive interconnect 116 (e.g., a conductive via) in the second interconnect opening 1602. In some embodiments, a planarization process is performed on the second conductive layer and second charged dielectric layer 124 after the second conductive layer is deposited over the second charged dielectric layer 124. In some embodiments, the planarization process comprises a CMP process or some other suitable planarization process. In some embodiments, the second conductive layer comprises copper, tungsten, aluminum, ruthenium, molybdenum, or some other suitable material and is deposited by a sputtering process, an ECD process, an ELD process, a CVD process, a PVD process, an ALD process, or some other suitable process.

Figure 18:
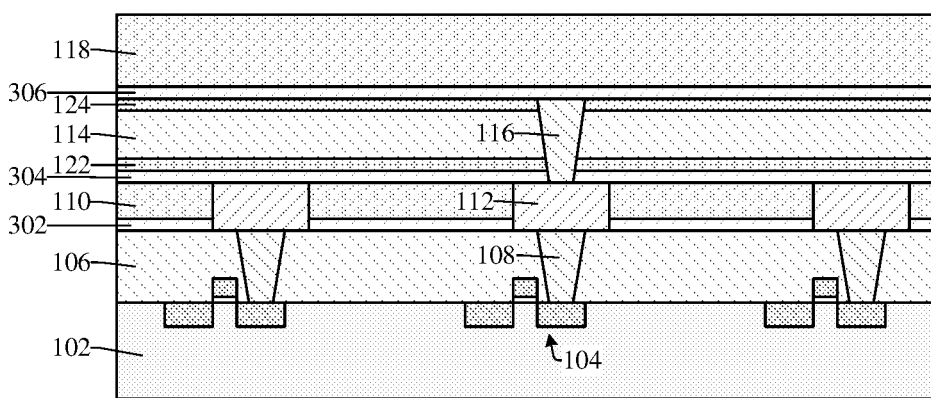

As shown in cross-sectional view 1800 of FIG. 18, a third ESL 306 is deposited over the second charged dielectric layer 124 and over the second conductive interconnect 116. Further, a third dielectric layer 118 is deposited over the third ESL 306. In some embodiments, the third ESL 306 comprises silicon nitride, silicon carbide, silicon carbonitride, or some other suitable material and is deposited by a CVD process, a PVD process, an ALD process, or some other suitable process. In some embodiments, the third dielectric layer 118 comprises silicon dioxide or some other suitable material and is deposited by a CVD process, a PVD process, an ALD process, or some other suitable process.

Figure 19:
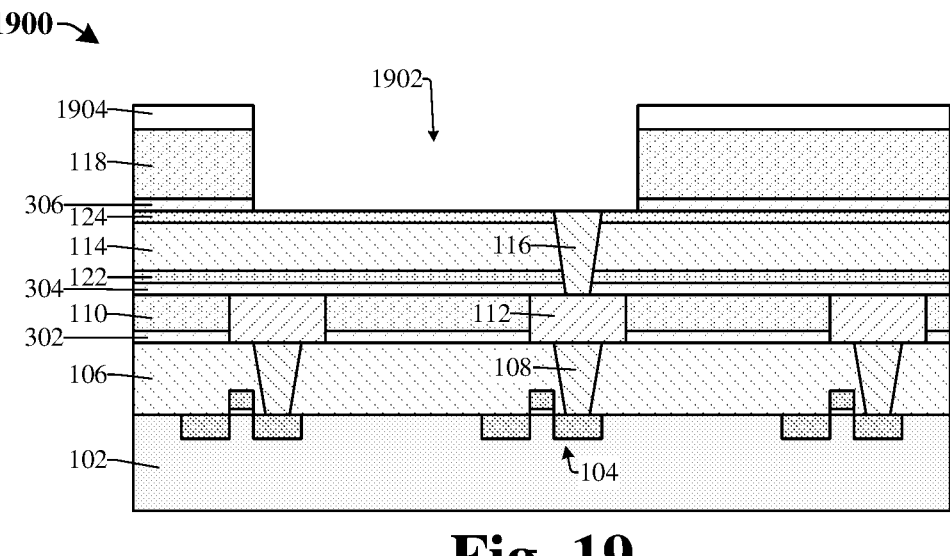

As shown in cross-sectional view 1900 of FIG. 19, the third dielectric layer 118 and the third ESL 306 are patterned to form a third interconnect opening 1902 in the third dielectric layer 118 and the third ESL 306. The third interconnect opening 1902 is delimited by sidewalls of the third dielectric layer 118 and sidewalls of the third ESL 306. In some embodiments, the patterning comprises forming a masking layer 1904 over the third dielectric layer 118 and etching the third dielectric layer 118 and the third ESL 306 according to the masking layer 1904. In some embodiments, the etching comprises a dry etching process or some other suitable process. In some embodiments, the masking layer 1904 is removed during and/or after the etching. In some embodiments, the etching comprises a first etch that extends through the third dielectric layer 118 and a second etch that extends through the third ESL 306. In some embodiments, the etching may extend into or through the second charged dielectric layer 124.

Figure 20:
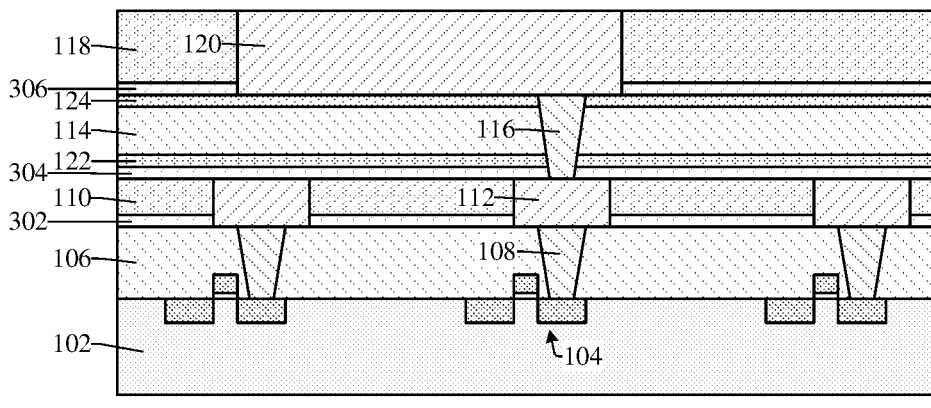

As shown in cross-sectional view 2000 of FIG. 20, a third conductive layer (not labeled) is deposited over the third dielectric layer 118 and in the third interconnect opening 1902 to form a third conductive interconnect 120 (e.g., a conductive line) in the third interconnect opening 1902. In some embodiments, a planarization process is performed on the third conductive layer and third dielectric layer 118 after the third conductive layer is deposited over the third dielectric layer 118. In some embodiments, the planarization process comprises a CMP process or some other suitable planarization process. In some embodiments, the third conductive layer comprises copper, tungsten, aluminum, ruthenium, molybdenum, or some other suitable material and is deposited by a sputtering process, an ECD process, an ELD process, a CVD process, a PVD process, an ALD process, or some other suitable process.

Figure 21:
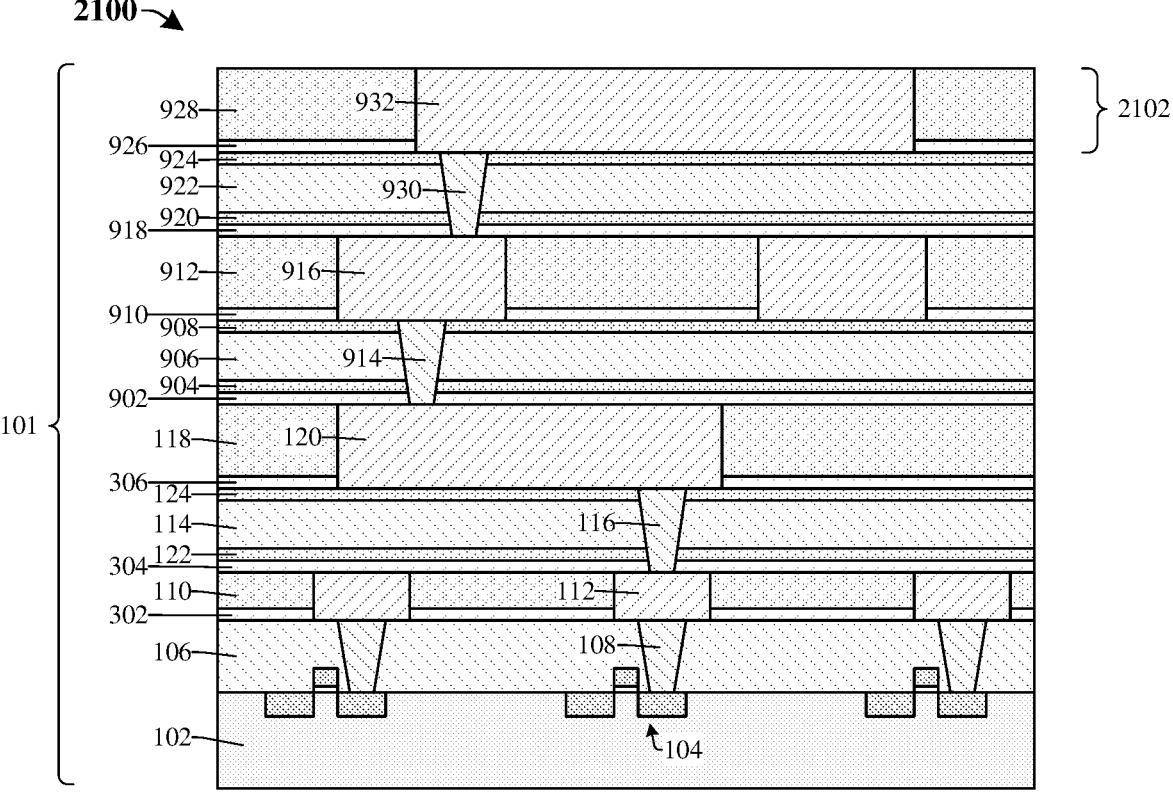

As shown in cross-sectional view 2100 of FIG. 21, a fourth ESL 902 is deposited over the third dielectric layer 118, a third charged dielectric layer 904 is deposited over the fourth ESL 902, a fourth dielectric layer 906 is deposited over the third charged dielectric layer 904, and a fourth charged dielectric layer 908 is deposited over the fourth dielectric layer 906. A fourth conductive interconnect 914 is formed over the third conductive interconnect 120 and within the fourth dielectric layer 906 using a method similar to the method illustrated in FIGS. 16 and 17. A fifth ESL 910 is deposited over the fourth charged dielectric layer 908 and a fifth dielectric layer 912 is deposited over the fifth ESL 910. A fifth conductive interconnect 916 is formed over the fourth conductive interconnect 914 and within the fifth dielectric layer 912 using a method similar to the method illustrated in FIGS. 19 and 20.

Further, a sixth ESL 918 is deposited over the fifth dielectric layer 912, a fifth charged dielectric layer 920 is deposited over the sixth ESL 918, a sixth dielectric layer 922 is deposited over the fifth charged dielectric layer 920, and a sixth charged dielectric layer 924 is deposited over the sixth dielectric layer 922. A sixth conductive interconnect 930 is formed over the fifth conductive interconnect 916 and within the sixth dielectric layer 922 using a method similar to the method illustrated in FIGS. 16 and 17. A seventh ESL 926 is deposited over the sixth charged dielectric layer 924 and a seventh dielectric layer 928 is deposited over the seventh ESL 926. A seventh conductive interconnect 932 is formed over the sixth conductive interconnect 930 and within the seventh dielectric layer 928 using a method similar to the method illustrated in FIGS. 19 and 20. In some embodiments, the substrate 102 through the seventh conductive interconnect 932 make up a first wafer portion 101 of an integrated chip. In some embodiments, the seventh dielectric layer 928 and the seventh conductive interconnect 932 form a first bonding layer 2102 (e.g., a first hybrid bonding layer).

Figure 22:
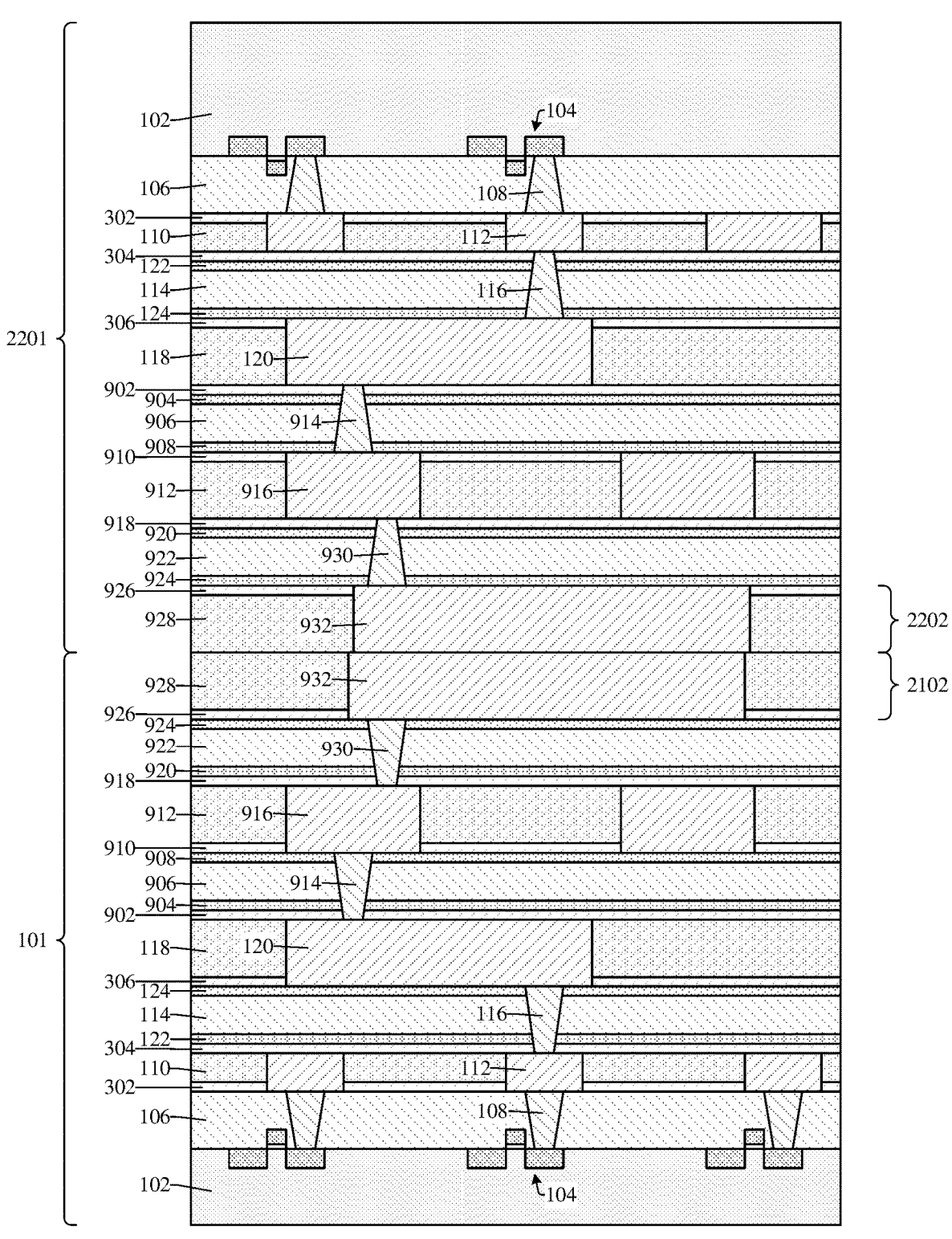

As shown in cross-sectional view 2200 of FIG. 22, a second wafer portion 2201 (e.g., including features similar to those of the first wafer portion 101) is bonded over the first wafer portion 101. For example, in some embodiments, a second bonding layer 2202 of the second wafer portion 2201 is bonded to the first bonding layer 2102 of the first wafer portion 101. In some embodiments, the bonding includes a fusion bonding process, plasma bonding process, a hybrid bonding process, or some other suitable bonding process. Conductive interconnects of the first wafer portion 101 are coupled to conductive interconnects of the second wafer portion 2201 as a result of the bonding.

Figure 23:
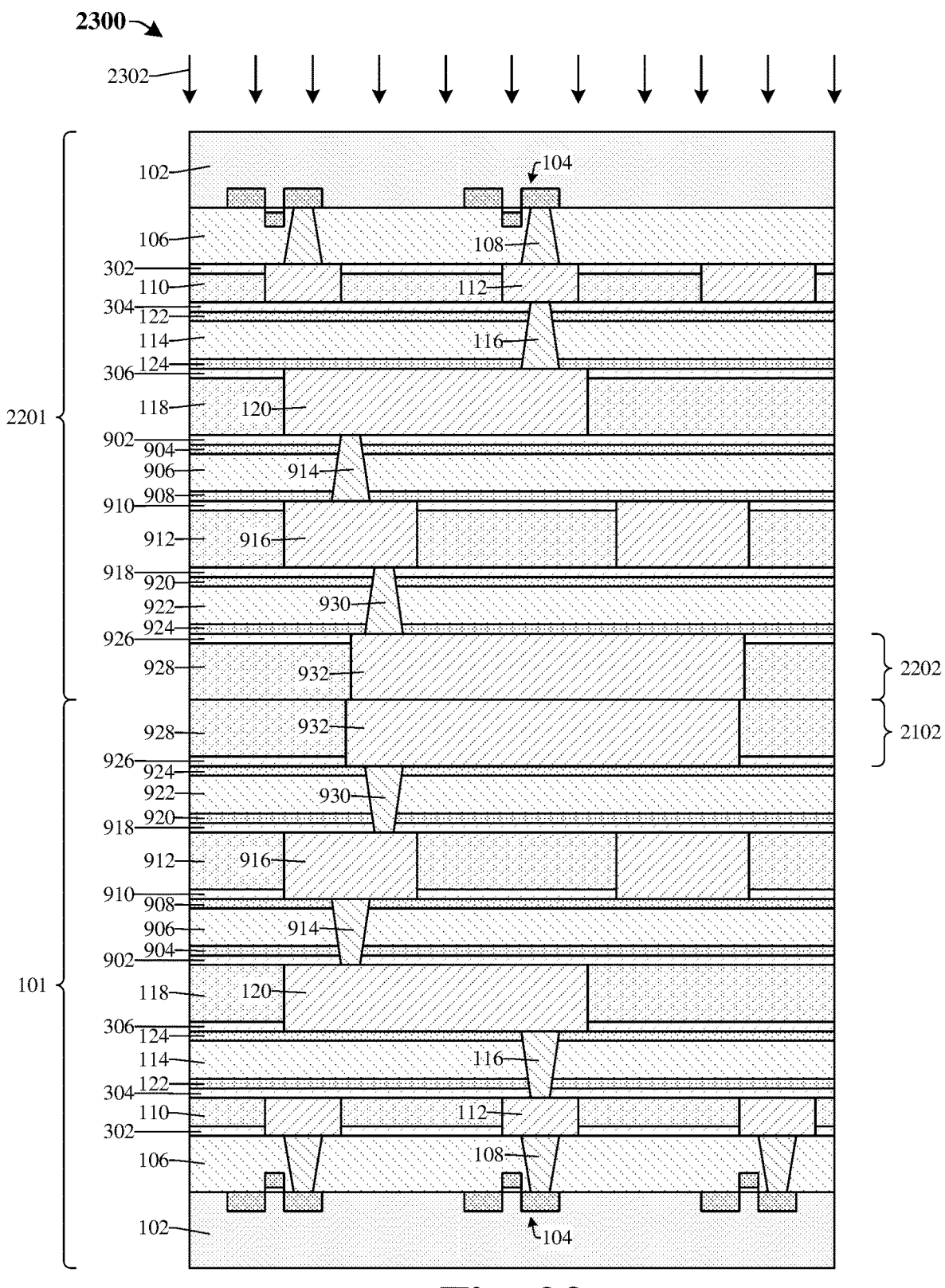

As shown in cross-sectional view 2300 of FIG. 23, the substrate 102 of the second wafer portion 2201 is thinned. For example, a grinding process (e.g., as illustrated by arrows 2302) is performed on a backside of the substrate 102 of the second wafer portion 2201 to reduce a thickness of the substrate 102. In some embodiments, the grinding process includes bringing a rotating grinding plate or the like into contact with the substrate 102 of the second wafer portion 2201 and applying a downward force on the substrate 102 with the rotating grinding plate to remove material from the substrate 102 of the second wafer portion 2201. The thinning may be performed so that a TSV (e.g., 2502 of FIG. 25) can be subsequently formed in the substrate 102 of the second wafer portion 2201.

By including charged dielectric layers (e.g., 122, 124) on opposite sides of dielectric layers (e.g., 114), the likelihood of those dielectric layers (e.g., 114) cracking during the grinding may be reduced. For example, because the fixed charge densities of the charged dielectric layers (e.g., 122, 124) have the same sign (e.g., same polarity), an electro-static force between the charged dielectric layers (e.g., 122, 124) repels the charged dielectric layers (e.g., 122, 124) from one another. The electrostatic force acting on the charged dielectric layers (e.g., 122, 124) may counteract the downward force exerted on the dielectric layer (e.g., 114) during the grinding. As a result, a likelihood of the dielectric layer (e.g., 114) being damaged due to the downward force may be reduced. Thus, a reliability of the dielectric layer may be improved.

Figure 24:
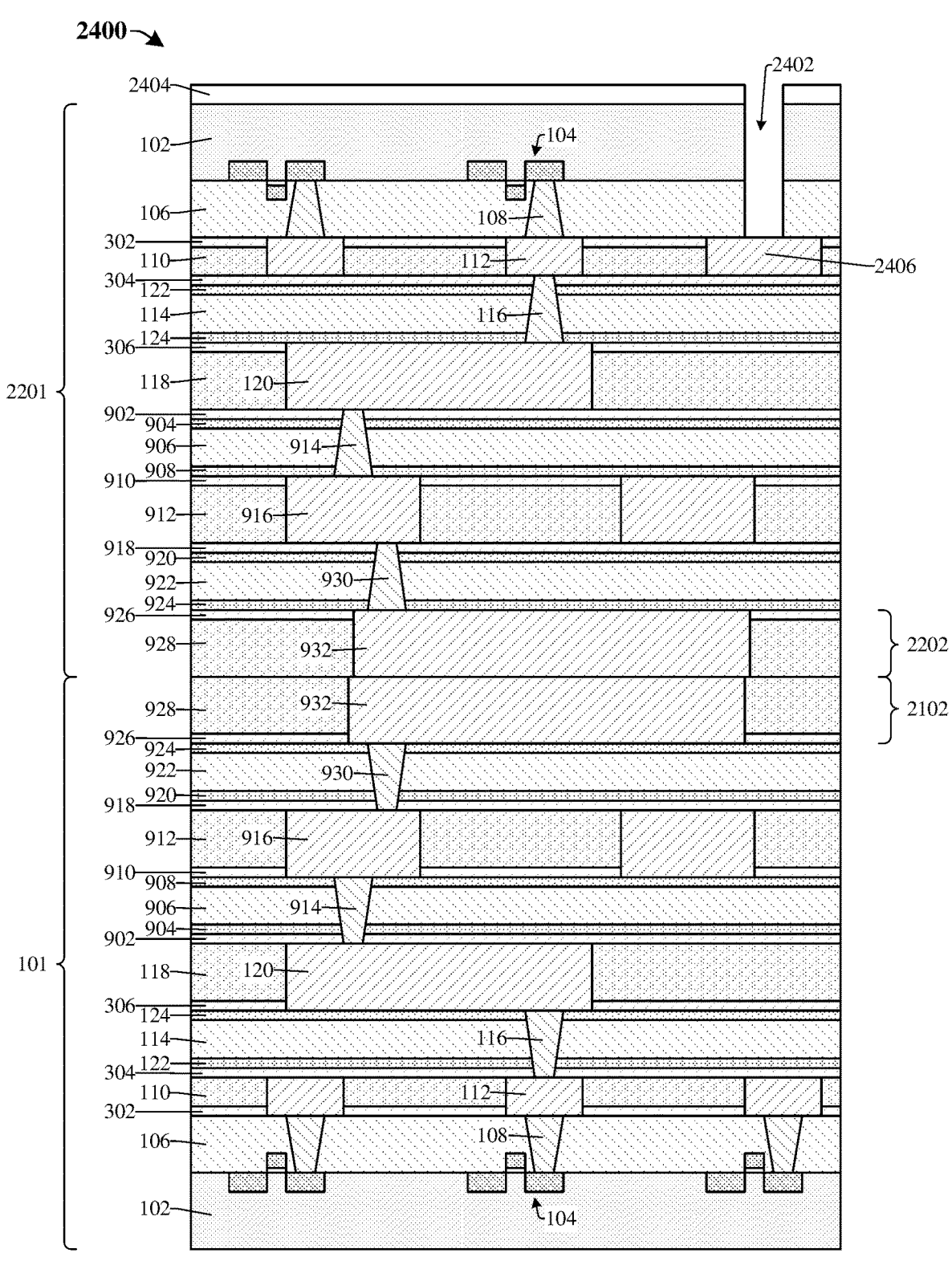

As shown in cross-sectional view 2400 of FIG. 24, the substrate 102 of the second wafer portion 2201 is patterned to form a TSV opening 2402 in the substrate 102. In some embodiments, the TSV opening 2402 extends through the substrate 102 of the second wafer portion 2201 and through dielectric layer 106 of the second wafer portion 2201 to a conductive interconnect 2406 of the second wafer portion 2201. In some embodiments, the patterning comprises form-ing a masking layer 2404 over the substrate 102 of the second wafer portion 2201 and etching the substrate 102 according to the masking layer 2404. In some embodiments, the etching may comprise a dry etching process or the like.

Figure 25:
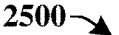

As shown in cross-sectional view 2500 of FIG. 25, a TSV 2502 is formed in the TSV opening 2402. In some embodi-ments, the TSV 2502 is formed by depositing a conductive layer over the substrate 102 of the second wafer portion 2201 and in the TSV opening 2402. The conductive layer may be subsequently patterned to form the TSV 2502 from the conductive layer.

FIGS. 26-30 illustrate cross-sectional views 2600-3000 of some other embodiments of a method for forming an inte-grated chip comprising a first charged dielectric layer 122 and a second charged dielectric layer 124 on opposite sides of a dielectric layer 114 overlying a substrate 102. Although FIGS. 26-30 are described in relation to a method, it will be appreciated that the structures disclosed in FIGS. 26-30 are not limited to such a method, but instead may stand alone as structures independent of the method.

Figure 26:
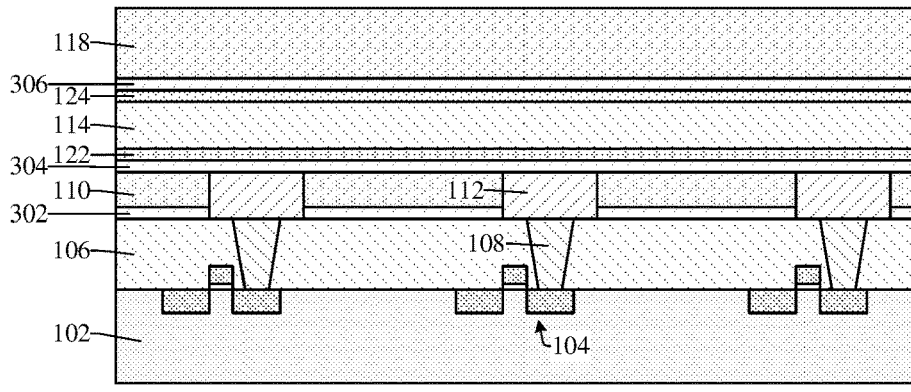
FIGS. 26-30 illustrate cross-sectional views of some other embodiments of a method for forming an integrated chip comprising a first charged dielectric layer and a second charged dielectric layer on opposite sides of a dielectric layer overlying a substrate.

As shown in cross-sectional view 2600 of FIG. 26, a semiconductor device 104 is formed along a substrate 102, a contact 108 is formed within a contact isolation layer 106 over the substrate 102, and a first conductive interconnect 112 is formed within a first dielectric layer 110 using a method similar to the method illustrated in FIGS. 10-14. Further, a second ESL 304 is deposited over the first dielectric layer 110. A first charged dielectric layer 122 is deposited over the second ESL 304. A second dielectric layer 114 is deposited over the first charged dielectric layer 122. A second charged dielectric layer 124 is deposited over the second dielectric layer 114. A third ESL 306 is deposited over the second charged dielectric layer 124. A third dielec-tric layer 118 is deposited over the third ESL 306.

Figure 27:
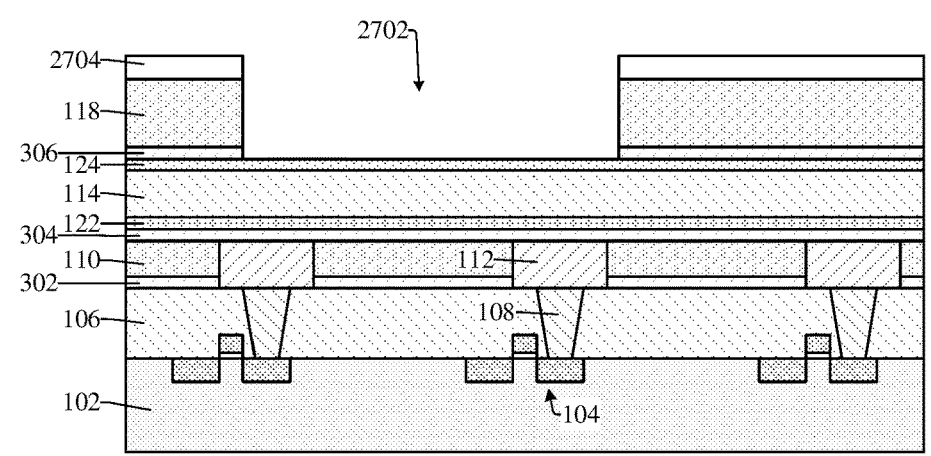

As shown in cross-sectional view 2700 of FIG. 27, the third dielectric layer 118 and the third ESL 306 are patterned to form an upper interconnect opening 2702 in the third dielectric layer 118 and the third ESL 306. The upper interconnect opening 2702 is delimited by sidewalls of the third dielectric layer 118 and sidewalls of the third ESL 306. In some embodiments, the patterning comprises forming a masking layer 2704 over the third dielectric layer 118 and etching the third dielectric layer 118 and the third ESL 306 according to the masking layer 2704. In some embodiments, the etching may extend through the third dielectric layer 118 but not the third ESL 306. In some embodiments, the etching may extend through the third ESL 306 and into or through the second charged dielectric layer 124.

Figure 28:
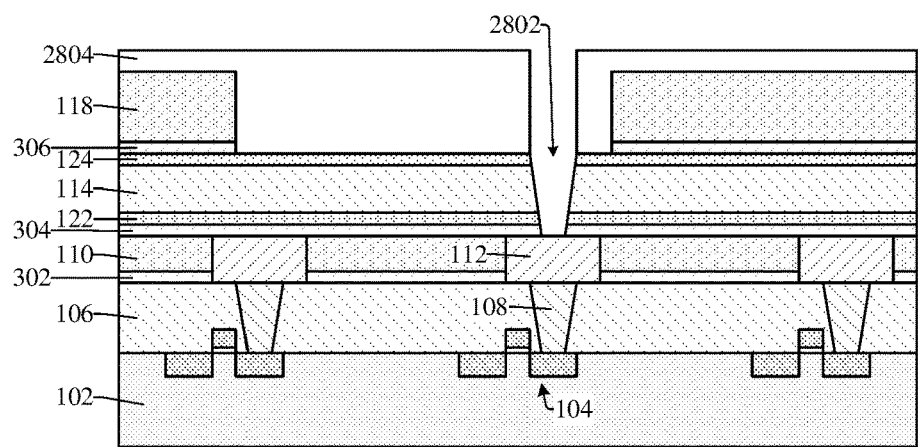

As shown in cross-sectional view 2800 of FIG. 28, the second charged dielectric layer 124, the second dielectric layer 114, the first charged dielectric layer 122, and the second ESL 304 are patterned to form a lower interconnect opening 2802 in the second charged dielectric layer 124, the second dielectric layer 114, the first charged dielectric layer 122, and the second ESL 304. The lower interconnect opening 2802 is delimited by sidewalls of the second charged dielectric layer 124, sidewalls of the second dielec-tric layer 114, sidewalls of the first charged dielectric layer 122, and sidewalls of the second ESL 304. In some embodi-ments, the patterning comprises forming a masking layer 2804 over the third dielectric layer 118 and the second charged dielectric layer 124, and etching the second charged dielectric layer 124, the second dielectric layer 114, the first charged dielectric layer 122, and the second ESL 304 according to the masking layer 2804.

Although FIGS. 27 and 28 illustrate forming the upper interconnect opening 2702 before forming the lower inter-connect opening 2802, it will be appreciated that in some embodiments, the lower interconnect opening 2802 can alternatively be formed before the upper interconnect open-ing 2702.

As shown in cross-sectional view 2900 of FIG. 29, a conductive layer (not labeled) is deposited over the third dielectric layer 118 and in both the lower interconnect opening 2802 and the upper interconnect opening 2702 to form a second conductive interconnect 116 in the lower interconnect opening 2802 and to form a third conductive interconnect 120 in the upper interconnect opening 2702. In some embodiments, a planarization process is performed on the conductive layer and the third dielectric layer 118 after the conductive layer is deposited over the third dielectric layer 118. In some embodiments, the planarization process comprises a CMP process or some other suitable planariza-tion process.

As shown in cross-sectional view 3000 of FIG. 30, a fourth ESL 902 is deposited over the third dielectric layer 118, a third charged dielectric layer 904 is deposited over the fourth ESL 902, a fourth dielectric layer 906 is deposited over the third charged dielectric layer 904, a fourth charged dielectric layer 908 is deposited over the fourth dielectric layer 906, a fifth ESL 910 is deposited over the fourth charged dielectric layer 908, and a fifth dielectric layer 912 is deposited over the fifth ESL 910. A fourth conductive interconnect 914 and a fifth conductive interconnect 916 are formed within the fourth dielectric layer 906 and within the fifth dielectric layer 912, respectively, using a method simi-lar to the method illustrated in FIGS. 27-29.

Further, a sixth ESL 918 is deposited over the fifth dielectric layer 912, a fifth charged dielectric layer 920 is deposited over the sixth ESL 918, a sixth dielectric layer 922 is deposited over the fifth charged dielectric layer 920, a sixth charged dielectric layer 924 is deposited over the sixth dielectric layer 922, a seventh ESL 926 is deposited over the sixth charged dielectric layer 924, and a seventh dielectric layer 928 is deposited over the seventh ESL 926. A sixth conductive interconnect 930 and a seventh conductive interconnect 932 are formed within the sixth dielectric layer 922 and within the seventh dielectric layer 928, respectively, using a method similar to the method illustrated in FIGS. 27-29.

In some embodiments, a second wafer portion (not shown) may be bonded over the seventh conductive interconnect 932 (e.g., as illustrated in FIG. 22). The second wafer portion may be subsequently thinned (e.g., via grinding process or the like, as illustrated in FIG. 23) and etched (e.g., as illustrated in FIG. 24) to form a TSV in the second wafer portion (e.g., as illustrated in FIG. 25).

FIGS. 31-38 illustrate cross-sectional views 3100-3800 of some other embodiments of a method for forming an integrated chip comprising a first charged dielectric layer 122 and a second charged dielectric layer 124 on opposite sides of a dielectric layer 114 overlying a substrate 102. Although FIGS. 31-38 are described in relation to a method, it will be appreciated that the structures disclosed in FIGS. 31-38 are not limited to such a method, but instead may stand alone as structures independent of the method.

Figure 31:
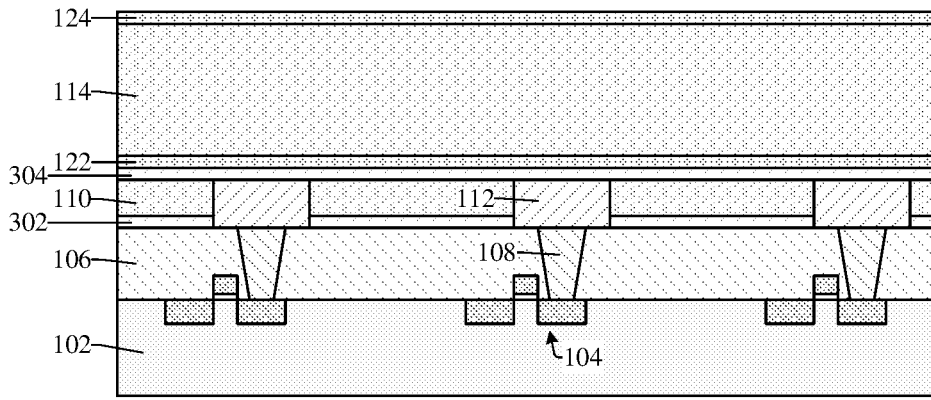
FIGS. 31-38 illustrate cross-sectional views of some other embodiments of a method for forming an integrated chip comprising a first charged dielectric layer and a second charged dielectric layer on opposite sides of a dielectric layer overlying a substrate.

As shown in cross-sectional view 3100 of FIG. 31, a semiconductor device 104 is formed along a substrate 102, a contact 108 is formed within a contact isolation layer 106 over the substrate 102, and a first conductive interconnect 112 is formed within a first dielectric layer 110 using a method similar to the method illustrated in FIGS. 10-14. Further, a second ESL 304 is deposited over the first dielectric layer 110. A first charged dielectric layer 122 is deposited over the second ESL 304. A second dielectric layer 114 is deposited over the first charged dielectric layer 122. A second charged dielectric layer is deposited over the second dielectric layer 114.

Figure 32:
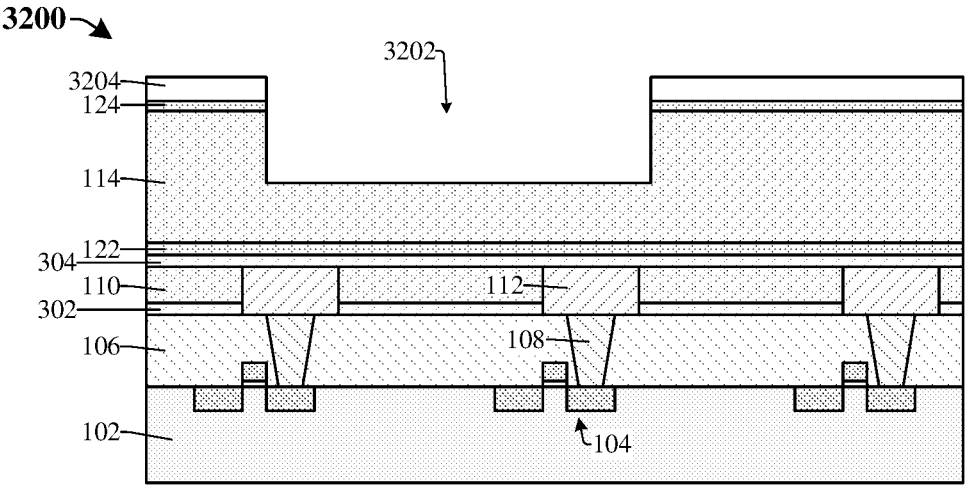

As shown in cross-sectional view 3200 of FIG. 32, the second charged dielectric layer 124 and the second dielectric layer 114 are patterned to form a first upper interconnect opening 3202 in the second charged dielectric layer 124 and the second dielectric layer 114. The first upper interconnect opening 3202 is delimited by sidewalls of the second charged dielectric layer 124 and sidewalls of the second dielectric layer 114. In some embodiments, the patterning comprises forming a masking layer 3204 over the second charged dielectric layer 124 and etching the second charged dielectric layer 124 and the second dielectric layer 114 according to the masking layer 3204.

Figure 33:
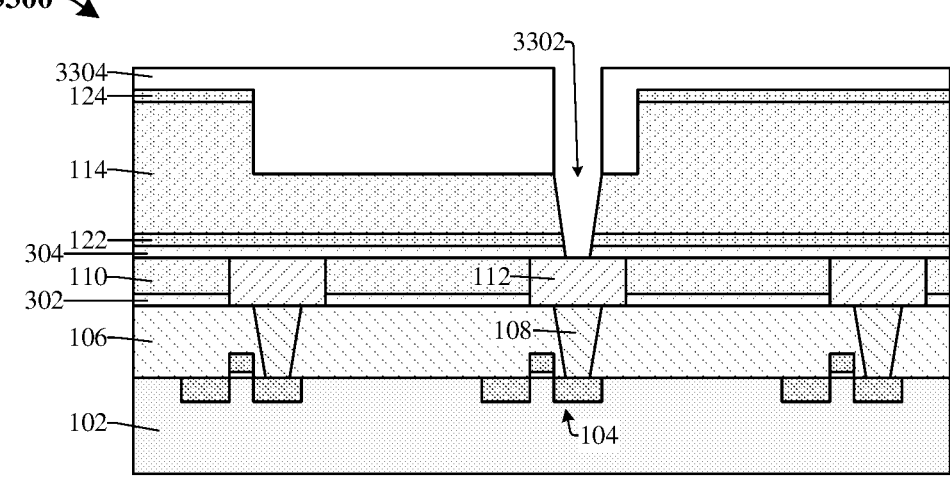

As shown in cross-sectional view 3300 of FIG. 33, the second dielectric layer 114, the first charged dielectric layer 122, and the second ESL 304 are patterned to form a first lower interconnect opening 3302 in the second dielectric layer 114, the first charged dielectric layer 122, and the second ESL 304. The first lower interconnect opening 3302 is delimited by sidewalls of the second dielectric layer 114, sidewalls of the first charged dielectric layer 122, and sidewalls of the second ESL 304. In some embodiments, the patterning comprises forming a masking layer 3304 over the second charged dielectric layer 124 and the second dielectric layer 114, and etching the second dielectric layer 114, the first charged dielectric layer 122, and the second ESL 304 according to the masking layer 3304.

Figure 34:
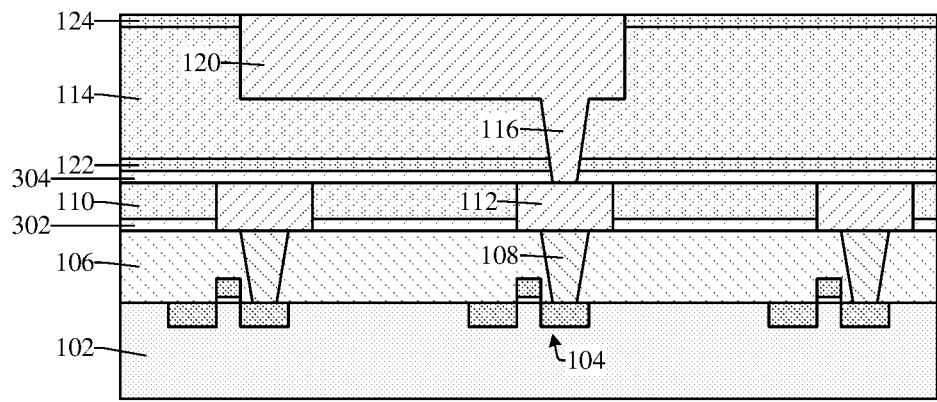

As shown in cross-sectional view 3400 of FIG. 34, a first conductive layer (not labeled) is deposited over the second charged dielectric layer 124 and in both the first lower interconnect opening 3302 and the first upper interconnect opening 3202 to form a second conductive interconnect 116 in the first lower interconnect opening 3302 and to form the third conductive interconnect 120 in the first upper interconnect opening 3202. In some embodiments, a planarization process is performed on the first conductive layer and the second charged dielectric layer 124 after the first conductive layer is deposited over the second charged dielectric layer 124. In some embodiments, the planarization process comprises a CMP process or some other suitable planarization process.

Figure 35:
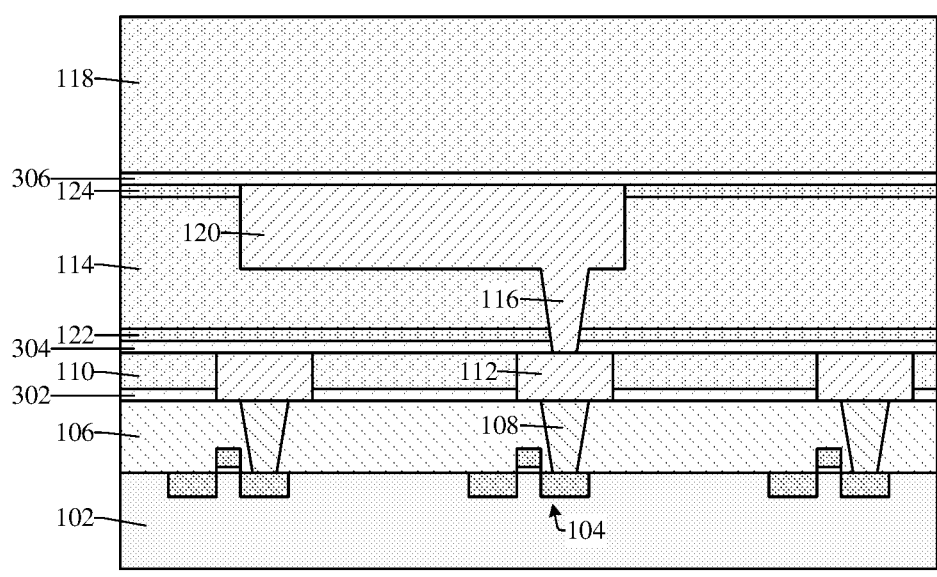

As shown in cross-sectional view 3500 of FIG. 35, a third ESL 306 is deposited over the second charged dielectric layer 124 and over the second conductive interconnect 116. A third dielectric layer 118 is deposited over the third ESL 306.

Figure 36:
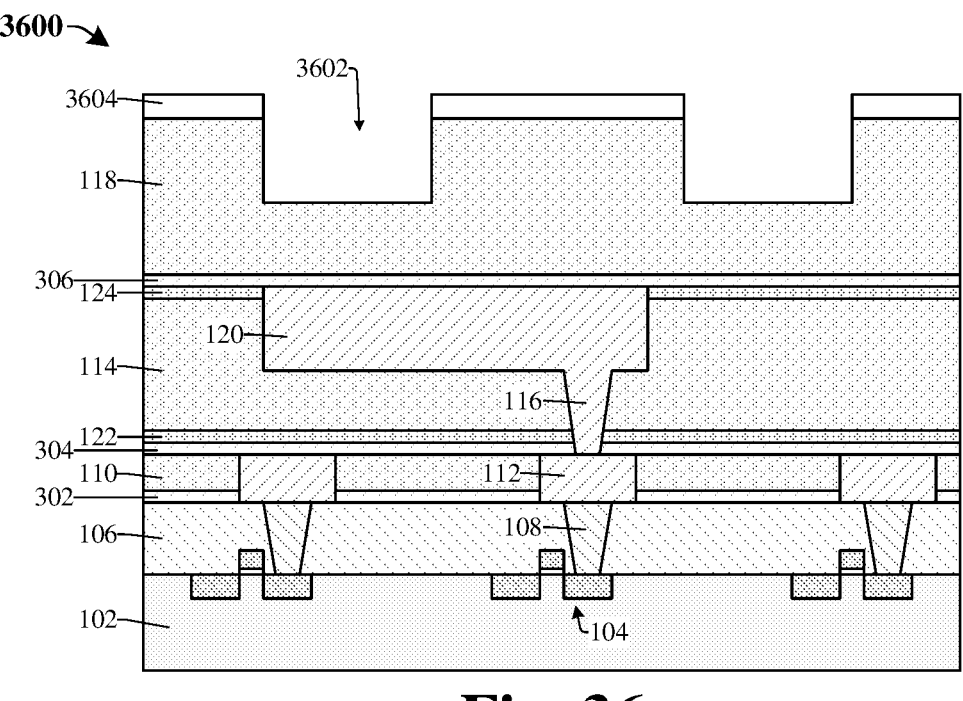

As shown in cross-sectional view 3600 of FIG. 36, the third dielectric layer 118 is patterned to form a second upper interconnect opening 3602 in the third dielectric layer 118. The second upper interconnect opening 3602 is delimited by sidewalls of the third dielectric layer 118. In some embodiments, the patterning comprises forming a masking layer 3604 over the third dielectric layer 118 and etching the third dielectric layer 118 according to the masking layer 3604.

Figure 37:
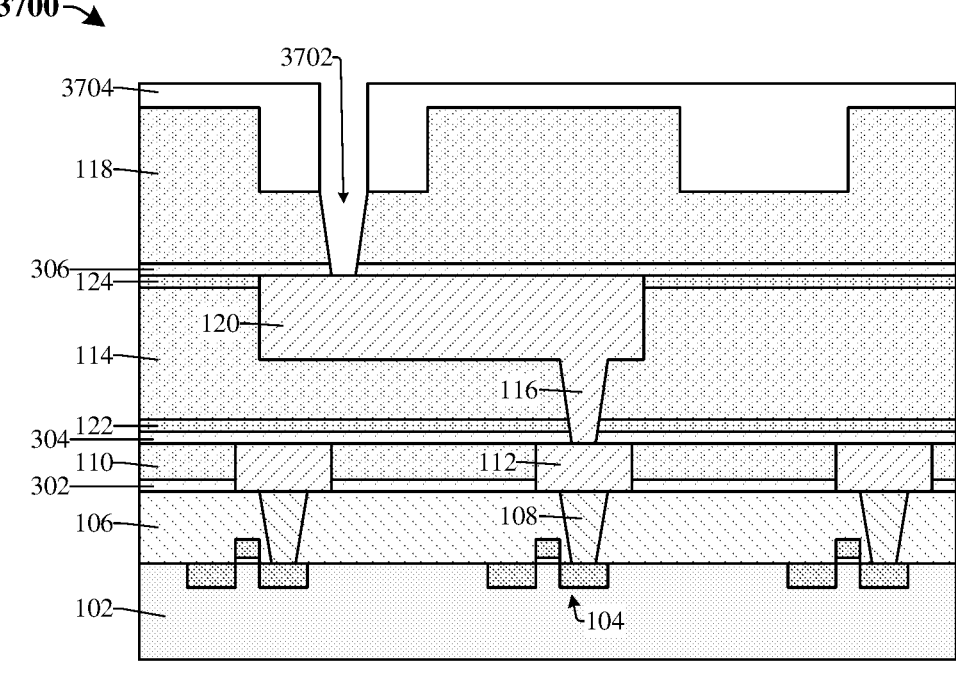

As shown in cross-sectional view 3700 of FIG. 37, the third dielectric layer 118 and the third ESL 306 are patterned to form a second lower interconnect opening 3702 in the third dielectric layer 118 and the third ESL 306. The second lower interconnect opening 3702 is delimited by sidewalls of the third dielectric layer 118 and sidewalls of the third ESL 306. In some embodiments, the patterning comprises forming a masking layer 3704 over the third dielectric layer 118 and etching the third dielectric layer 118 and the third ESL 306 according to the masking layer 3704.

Figure 38:
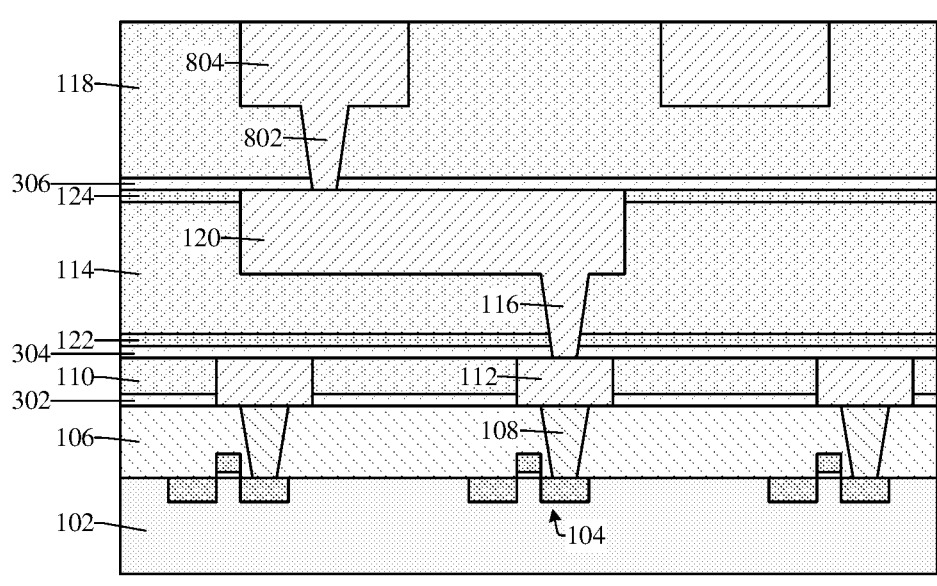

As shown in cross-sectional view 3800 of FIG. 38, a second conductive layer (not labeled) is deposited over the third dielectric layer 118 and in both the second lower interconnect opening 3702 and the second upper interconnect opening 3602 to form a fourth conductive interconnect 802 in the second lower interconnect opening 3702 and to form a fifth conductive interconnect 804 in the second upper interconnect opening 3602. In some embodiments, a planarization process is performed on the second conductive layer and third dielectric layer 118 after the second conductive layer is deposited over the third dielectric layer 118. In some embodiments, the planarization process comprises a CMP process or some other suitable planarization process.

In some embodiments, a second wafer portion (not shown) may be bonded over the fifth conductive interconnect 804 (e.g., as illustrated in FIG. 22). The second wafer portion may be subsequently thinned (e.g., via grinding process or the like, as illustrated in FIG. 23) and etched (e.g., as illustrated in FIG. 24) to form a TSV in the second wafer portion (e.g., as illustrated in FIG. 25).

FIG. 39 illustrates a flow diagram of some embodiments of a method 3900 for forming an integrated chip comprising a first charged dielectric layer and a second charged dielectric layer on opposite sides of a dielectric layer overlying a substrate. While method 3900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 3902, deposit a first dielectric layer over a substrate. FIG. 12 illustrates a cross-sectional view 1200 of some embodiments corresponding to block 3902.

At block 3904, pattern the first dielectric layer to form a first opening in the first dielectric layer. FIG. 13 illustrates a cross-sectional view 1300 of some embodiments corresponding to block 3904.

At block 3906, deposit a first conductive layer in the first opening to form a first conductive interconnect in the first opening. FIG. 14 illustrates a cross-sectional view 1400 of some embodiments corresponding to block 3906.

At block 3908, deposit a first etch stop layer (ESL) over the first dielectric layer. FIG. 15 illustrates a cross-sectional view 1500 of some embodiments corresponding to block 3908. FIG. 26 illustrates a cross-sectional view 2600 of some other embodiments corresponding to block 3908. FIG. 31 illustrates a cross-sectional view 3100 of some other embodiments corresponding to block 3908.

At block 3910, deposit a first charged dielectric layer over the first ESL. FIG. 15 illustrates a cross-sectional view 1500 of some embodiments corresponding to block 3910. FIG. 26 illustrates a cross-sectional view 2600 of some other embodiments corresponding to block 3910. FIG. 31 illustrates a cross-sectional view 3100 of some other embodiments corresponding to block 3910.

At block 3912, deposit a second dielectric layer over the first charged dielectric layer. FIG. 15 illustrates a cross-sectional view 1500 of some embodiments corresponding to block 3912. FIG. 26 illustrates a cross-sectional view 2600 of some other embodiments corresponding to block 3912. FIG. 31 illustrates a cross-sectional view 3100 of some other embodiments corresponding to block 3912.

At block 3914, deposit a second charged dielectric layer over the second dielectric layer. FIG. 15 illustrates a cross-sectional view 1500 of some embodiments corresponding to block 3914. FIG. 26 illustrates a cross-sectional view 2600 of some other embodiments corresponding to block 3914. FIG. 31 illustrates a cross-sectional view 3100 of some other embodiments corresponding to block 3914.

At block 3916, pattern the second charged dielectric layer, the second dielectric layer, the first charged dielectric layer, and the first ESL to form a second opening in the second charged dielectric layer, the second dielectric layer, the first charged dielectric layer, and the first ESL. FIG. 16 illustrates a cross-sectional view 1600 of some embodiments corresponding to block 3916. FIG. 28 illustrates a cross-sectional view 2800 of some other embodiments corresponding to block 3916. FIG. 32 and/or FIG. 33 illustrate cross-sectional views 3200, 3300 of some other embodiments corresponding to block 3916.

At block 3918, deposit a second conductive layer in the second opening to form a second conductive interconnect in the second opening. FIG. 17 illustrates a cross-sectional view 1700 of some embodiments corresponding to block 3918. FIG. 29 illustrates a cross-sectional view 2900 of some other embodiments corresponding to block 3918. FIG. 34 illustrates a cross-sectional view 3400 of some other embodiments corresponding to block 3918.

At block 3920, deposit a second ESL over the second charged dielectric layer. FIG. 18 illustrates a cross-sectional view 1800 of some embodiments corresponding to block 3920. FIG. 26 illustrates a cross-sectional view 2600 of some other embodiments corresponding to block 3920. FIG.

35 illustrates a cross-sectional view 3500 of some other embodiments corresponding to block 3920.

At block 3922, deposit a third dielectric layer over the second ESL. FIG. 18 illustrates a cross-sectional view 1800 of some embodiments corresponding to block 3922. FIG. 26 illustrates a cross-sectional view 2600 of some other embodiments corresponding to block 3922. FIG. 35 illustrates a cross-sectional view 3500 of some other embodiments corresponding to block 3922.

At block 3924, pattern the third dielectric layer to form a third opening in the third dielectric layer. FIG. 19 illustrates a cross-sectional view 1900 of some embodiments corresponding to block 3924. FIG. 27 illustrates a cross-sectional view 2700 of some other embodiments corresponding to block 3924. FIG. 36 and/or FIG. 37 illustrate cross-sectional views 3600, 3700 of some other embodiments corresponding to block 3924.

At block 3926, deposit a third conductive layer in the third opening to form a third conductive interconnect in the third opening. FIG. 20 illustrates a cross-sectional view 2000 of some embodiments corresponding to block 3926. FIG. 29 illustrates a cross-sectional view 2900 of some other embodiments corresponding to block 3926. FIG. 38 illustrates a cross-sectional view 3800 of some other embodiments corresponding to block 3926.

In some embodiments, method 3900 further includes bonding a second substrate over the substrate, grinding the second substrate to thin the second substrate, and forming a TSV in the second substrate.

Thus, the present disclosure relates to an integrated chip and a method for forming the integrated chip, the integrated chip including a pair of charged dielectric layers disposed on opposite sides of a dielectric layer overlying a substrate for improving a reliability of the integrated chip.

Accordingly, in some embodiments, the present disclosure relates to an integrated chip including a first dielectric layer overlying a substrate and a first conductive interconnect within the first dielectric layer. A bonding layer is over the first dielectric layer. The bonding layer includes a bonding dielectric layer and a bonding interconnect in the bonding dielectric layer. A first charged dielectric layer is along a bottom of the first dielectric layer. A second charged dielectric layer is along a top of the first dielectric layer. The first charged dielectric layer and the second charged dielectric layer have a same polarity.

In other embodiments, the present disclosure relates to an integrated chip including a first semiconductor substrate and a semiconductor device arranged along the first semiconductor substrate. A first etch stop layer (ESL) overlies the first semiconductor substrate. The first ESL includes a first dielectric. A first charged dielectric layer overlies the first ESL. The first charged dielectric layer includes a second dielectric, different from the first dielectric, having a first fixed charge density. A first dielectric layer overlies the first charged dielectric layer. A first conductive via is within first dielectric layer. A second charged dielectric layer overlies the first dielectric layer. The second charged dielectric layer includes a third dielectric having a second fixed charge density. The first fixed charge density has a first sign and the second fixed charged density has the first sign. A first bonding layer overlies the second charged dielectric layer. The first bonding layer includes a first bonding interconnect in a first bonding dielectric layer. A second bonding layer overlies the first bonding layer. The second bonding layer includes a second bonding interconnect in a second bonding dielectric layer. The second bonding interconnect is bonded to the first bonding interconnect. A second semiconductor substrate is over the second bonding layer.

In yet other embodiments, the present disclosure relates to a method for forming an integrated chip. The method includes depositing a first etch stop layer (ESL) over a first substrate. A first charged dielectric layer is deposited over the first ESL. The first charged dielectric layer has a first thickness and a first polarity. A first dielectric layer is deposited over the first charged dielectric layer. A second charged dielectric layer is deposited over the first dielectric layer. The second charged dielectric layer has a second thickness and the first polarity. The second charged dielectric layer, the first dielectric layer, the first charged dielectric layer, and the first ESL are patterned to form a first opening in the second charged dielectric layer, the first dielectric layer, the first charged dielectric layer, and the first ESL. A first conductive layer is deposited in the first opening to form a first conductive interconnect in the first opening. A first bonding layer is formed over the second charged dielectric layer. The first bonding layer includes a first bonding interconnect in a first bonding dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:

depositing a first etch stop layer (ESL) over a first conductive line and a first substrate;

depositing a first charged dielectric layer on and contacting an upper surface of the first ESL, the first charged dielectric layer having a first thickness and a first polarity;

depositing a first dielectric layer over the first charged dielectric layer;

depositing a second charged dielectric layer over the first dielectric layer, the second charged dielectric layer having a second thickness and the first polarity;

depositing a second ESL on and contacting an upper surface of the second charged dielectric layer;

patterning the second charged dielectric layer, the first dielectric layer, the first charged dielectric layer, and the first ESL to form a first opening in the second charged dielectric layer, the first dielectric layer, the first charged dielectric layer, and the first ESL;

depositing a first conductive layer in the first opening to form a first conductive via in the first opening; and forming a second conductive line over the first conductive via.

2. The method of claim 1, further comprising:

bonding a second substrate over the first substrate; and performing a grinding process on the second substrate while the second substrate is bonded over the first substrate.

3. The method of claim 1, further comprising:

controlling a first temperature of the first charged dielectric layer while depositing the first charged dielectric layer to control a fixed charge density of the first charged dielectric layer; and controlling a second temperature of the second charged dielectric layer while depositing the second charged dielectric layer to control a fixed charge density of the second charged dielectric layer.

4. The method of claim 1, wherein depositing the first charged dielectric layer comprises depositing a first charged dielectric film on and contacting the upper surface of the first ESL and depositing a second charged dielectric film on and contacting an upper surface of the first charged dielectric film, wherein depositing the second charged dielectric layer comprises depositing a third charged dielectric film over the first dielectric layer and depositing a fourth charged dielectric film on and contacting an upper surface of the third charged dielectric film, wherein the second ESL contacts an upper surface of the fourth charged dielectric film.

5. The method of claim 1, wherein the first ESL comprises a first dielectric, and wherein the first charged dielectric layer comprises a second dielectric different than the first dielectric.

6. The method of claim 5, wherein the second charged dielectric layer comprises a third dielectric, wherein the second ESL comprises a fourth dielectric different than the third dielectric, and wherein the first dielectric layer comprises a fifth dielectric different than the first dielectric, the second dielectric, the third dielectric, and the fourth dielectric.

7. The method of claim 1, wherein the first thickness and the second thickness are approximately equal.

8. The method of claim 1, further comprising:

depositing a second dielectric layer on and contacting an upper surface of the second ESL;

depositing a third ESL on and contacting an upper surface of the second dielectric layer;

depositing a third charged dielectric layer on and contacting an upper surface of the third ESL, the third charged dielectric layer having a third thickness and the first polarity;

depositing a third dielectric layer on and contacting an upper surface of the third charged dielectric layer; and depositing a fourth charged dielectric layer on and contacting an upper surface of the third dielectric layer, the fourth charged dielectric layer having a fourth thickness and the first polarity.

9. The method of claim 8, wherein the first thickness and the second thickness are less than the third thickness and the fourth thickness.

10. The method of claim 8, wherein the first thickness is approximately equal to the second thickness, and wherein the third thickness is approximately equal to the fourth thickness.

11. The method of claim 1, wherein the first charged dielectric layer comprises a first dielectric, and wherein the second charged dielectric layer comprises the first dielectric.

12. The method of claim 1, wherein the first dielectric layer is deposited on and contacting an upper surface of the first charged dielectric layer, and wherein the second charged dielectric layer is deposited on and contacting an upper surface of the first dielectric layer.

13. The method of claim 1, wherein the second conductive line is formed on and contacting an upper surface of the second ESL.

14. The method of claim 1, wherein the second conductive line contacts the upper surface of the second charged dielectric layer and sidewalls of the second ESL.

15. The method of claim 1, wherein the second conductive line contacts an upper surface of the first dielectric layer and sidewalls of the second charged dielectric layer.

16. The method of claim 1, wherein the second conductive line contacts an upper surface of the first conductive via and the upper surface of the second charged dielectric layer.

17. A method for forming an integrated chip, the method comprising:

depositing a first etch stop layer (ESL) over a first conductive line and a first substrate;

depositing a first charged dielectric layer on an upper surface of the first ESL, the first charged dielectric layer having a first thickness and a first polarity;

depositing a second charged dielectric layer on and contacting the first charged dielectric layer, the second charged dielectric layer having a second thickness and the first polarity;

depositing a first dielectric layer over the second charged dielectric layer;

depositing a third charged dielectric layer over the first dielectric layer, the third charged dielectric layer having a third thickness and the first polarity;

depositing a fourth charged dielectric layer on and contacting the third charged dielectric layer, the fourth charged dielectric layer having a fourth thickness and the first polarity;

depositing a second ESL on an upper surface of the fourth charged dielectric layer;

patterning the fourth charged dielectric layer, the third charged dielectric layer, the first dielectric layer, the second charged dielectric layer, the first charged dielectric layer, and the first ESL to form a first opening in the fourth charged dielectric layer, the third charged dielectric layer, the first dielectric layer, the second charged dielectric layer, the first charged dielectric layer, and the first ESL;

depositing a first conductive layer in the first opening to form a first conductive via in the first opening; and forming a second conductive line over the first conductive via.

18. The method of claim 17, wherein the first charged dielectric layer contacts the upper surface of the first ESL, wherein the first dielectric layer contacts an upper surface of the second charged dielectric layer, wherein the third charged dielectric layer contacts an upper surface of the first dielectric layer, and wherein the second ESL contacts the upper surface of the fourth charged dielectric layer.

19. A method for forming an integrated chip, the method comprising:

depositing a first etch stop layer (ESL) over a first conductive line and a first substrate;

depositing a first charged dielectric layer on an upper surface of the first ESL, the first charged dielectric layer having a first thickness and a first polarity;

depositing a first dielectric layer over the first charged dielectric layer;

depositing a second charged dielectric layer over the first dielectric layer, the second charged dielectric layer having a second thickness and the first polarity;

depositing a second ESL on an upper surface of the second charged dielectric layer;

patterning the second charged dielectric layer, the first dielectric layer, the first charged dielectric layer, and the first ESL to form a first opening in the second charged dielectric layer, the first dielectric layer, the first charged dielectric layer, and the first ESL;

depositing a first conductive layer in the first opening to form a first conductive via in the first opening; and forming a second conductive line on and contacting an upper surface of the first conductive via and the upper surface of the second charged dielectric layer.

20. The method of claim 19, wherein the first charged dielectric layer contacts the upper surface of the first ESL, wherein the first dielectric layer contacts an upper surface of the first charged dielectric layer, wherein the second charged dielectric layer contacts an upper surface of the first dielectric layer, and wherein the second ESL contacts the upper surface of the second charged dielectric layer.

* * * * *